(12) United States Patent
Horita et al.

(10) Patent No.: US 11,329,494 B2
(45) Date of Patent: May 10, 2022

(54) MOBILE DEVICE

(71) Applicant: SEIKO EPSON CORPORATION, Tokyo (JP)

(72) Inventors: Ryohei Horita, Nagano (JP); Nobuaki Ito, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 132 days.

(21) Appl. No.: 16/942,856

(22) Filed: Jul. 30, 2020

(65) Prior Publication Data
US 2021/0036532 A1 Feb. 4, 2021

(30) Foreign Application Priority Data

Aug. 1, 2019 (JP) .............................. JP2019-142072

(51) Int. Cl.
| | |
|---|---|
| *H01M 10/46* | (2006.01) |
| *H02J 7/00* | (2006.01) |
| *H05K 5/00* | (2006.01) |
| *G06K 15/00* | (2006.01) |
| *H04M 1/02* | (2006.01) |

(52) U.S. Cl.
CPC .......... *H02J 7/0063* (2013.01); *H02J 7/0042* (2013.01); *H02J 7/0048* (2020.01); *H05K 5/0086* (2013.01); *G06K 15/4055* (2013.01); *H04M 1/0262* (2013.01)

(58) Field of Classification Search
CPC ...... H02J 7/0063; H02J 7/0047; H02J 7/0042; H02J 7/0048; H05K 5/0086

USPC ................. 320/103, 107, 116, 114, 132, 149
See application file for complete search history.

(56) References Cited

U.S. PATENT DOCUMENTS

| | | | |
|---|---|---|---|
| 5,183,716 A | 2/1993 | Nakacho et al. | |
| 2013/0307464 A1* | 11/2013 | Zhu | H02J 7/005 320/111 |
| 2018/0120915 A1* | 5/2018 | Li | G06F 1/3212 |

FOREIGN PATENT DOCUMENTS

| | | |
|---|---|---|
| JP | H02-223158 A | 9/1990 |
| JP | 2016-175374 A | 10/2016 |

* cited by examiner

*Primary Examiner* — Edward Tso
(74) *Attorney, Agent, or Firm* — Global IP Counselors, LLP

(57) ABSTRACT

A mobile device includes a driving circuit, a first accommodation section configured to accommodate a first battery which supplies electric power to the driving circuit and which is an all-solid-state battery having a solid electrolyte, a control circuit configured to control the driving circuit such that driving is performed in one of a plurality of modes including a first mode and a second mode in which power consumption is smaller than the first mode, and a determination circuit configured to determine whether electric power is supplied from an external power source to the first battery. When the determination circuit determines that the electric power is supplied from the external power source to the first battery, the control circuit performs switching from the second mode to the first mode.

5 Claims, 13 Drawing Sheets

MOBILE DEVICE

The present application is based on, and claims priority from JP Application Serial Number 2019-142072, filed Aug. 1, 2019, the disclosure of which is hereby incorporated by reference herein in its entirety.

BACKGROUND

1. Technical Field

The present disclosure relates to a mobile device.

2. Related Art

In general, small light portable mobile devices having a driving element have been proposed. In recent years, all-solid-state batteries having a solid electrolyte have been developed as a battery to be used for such a mobile device. For example, JP-A-2016-175374 discloses, as an example of such a mobile device, a portable liquid ejecting apparatus including a lithium-ion battery having a liquid electrolyte as a battery, for example. Furthermore, JP-A-2-223158 discloses an example of an all-solid-state battery which may be used for the mobile device disclosed in JP-A-2016-175374.

For example, according to the mobile device using an electrolytic solution battery having a liquid electrolyte disclosed in JP-A-2016-175374, even in a case where the mobile device is coupled to an external power source, such as an AC adapter, when a charge level stored in the electrolytic solution battery does not reach a predetermined value since charge efficiency of the electrolytic solution battery is low, the mobile device may be driven in a power saving mode in which power consumption is small. In such a power saving mode, a process of reducing a processing speed of the mobile device and a process of restricting a number of functions, for example, are executed so as to reduce power consumption of the mobile device.

On the other hand, according to the all-solid-state battery having a solid electrolyte disclosed in JP-A-2-223158, the electrolyte is not likely to be decomposed at a time of charging, and therefore, charge may be performed with a high voltage. Consequently, it is advantageous in that higher charge efficiency is attained when compared with electrolytic solution batteries.

When the all-solid-state battery disclosed in JP-A-2-223158 is employed in the mobile device driven by the electrolytic solution battery disclosed in JP-A-2016-175374, although charge efficiency of the battery is improved, a power saving mode of the mobile device may be unnecessarily continued, and consequently, usability may be degraded.

SUMMARY

According to an aspect of the present disclosure, a mobile device includes a driving circuit, a first accommodation section configured to accommodate a first battery which supplies electric power to the driving circuit and which is an all-solid-state battery having a solid electrolyte, a control circuit configured to control the driving circuit such that driving is performed in one of a plurality of modes including a first mode and a second mode in which power consumption is smaller than the first mode, and a determination circuit configured to determine whether electric power is supplied from an external power source to the first battery. When the determination circuit determines that the electric power is supplied from the external power source to the first battery, the control circuit performs switching from the second mode to the first mode.

The mobile device may further include an input section configured to input an instruction issued by a user. When receiving an instruction indicating that the switching between the second mode and the first mode is permitted based on a result of the determination performed by the determination circuit from the input section, the control circuit may perform the switching from the second mode to the first mode in accordance with a result of the determination indicating that the electric power is supplied from the external power source to the first battery made by the determination circuit. When receiving an instruction indicating that the switching between the first mode and the second mode is not permitted based on a result of the determination performed by the determination circuit from the input section, the control circuit may not perform the switching from the second mode to the first mode in accordance with a result of the determination indicating that the electric power is supplied from the external power source to the first battery made by the determination circuit.

The mobile device may further include a first obtaining circuit configured to obtain a remaining battery level of the first battery accommodated in the first accommodation section. When an instruction indicating that the switching between the first mode and the second mode is not permitted is input based on a result of the determination made by the determination circuit from the input section, the control circuit may perform the switching from the second mode to the first mode in accordance with the remaining battery level obtained by the first obtaining circuit.

The mobile device may further include a first obtaining circuit configured to obtain a remaining battery level of a first battery accommodated in the first accommodation section. The control circuit may perform switching from the first mode to the second mode in accordance with the remaining battery level obtained by the first obtaining circuit.

The mobile device may further include a second accommodation section configured to accommodate a second battery which supplies electric power to the driving circuit and which is an electrolytic solution battery having a liquid electrolyte and a second obtaining circuit configured to obtain a remaining battery level of the second battery accommodated in the second accommodation section. When the second battery supplies electric power to the driving circuit, the control circuit may perform switching from the second mode to the first mode in accordance with the remaining battery level obtained by the second obtaining circuit.

DESCRIPTION OF EXEMPLARY EMBODIMENTS

Preferred embodiments of the present disclosure will be described hereinafter with reference to the accompanying drawings. The drawings are used for explanatory convenience. Note that the embodiments described below do not unduly limit the present disclosure described in claims. Furthermore, it is not necessarily the case that all components described below are requirements of the present disclosure.

1. First Embodiment

Description will be made taking a mobile ink jet printer serving as a liquid ejecting apparatus which forms an image on a medium by ejecting ink as liquid and which may be driven based on electric power supplied from a battery as an example of a mobile device according to a first embodiment. Note that the mobile ink jet printer is simply referred to as a mobile printer in the description below. Furthermore, examples of the medium on which an image is formed by the mobile printer include various recording sheets including plain paper to be used for printing of images and the like, glossy paper to be used for printing of photographs and the like, and postcards.

1.1 Appearance of Mobile Printer

First, an appearance configuration of a mobile device M will be described with reference to FIGS. 1 to 3. Note that X, Y, and Z axes are orthogonally intersect with one another in the description below. A starting point side in the X axis is referred to as a "−X direction" and an opposite side of the starting point side is referred to as a "+X direction" where appropriate, and furthermore, the "−X direction" and the "+X direction" are collectively referred to as an "X direction" where appropriate. Similarly, a starting point side in the Y axis is referred to as a "−Y direction" and an opposite side of the starting point side is referred to as a "+Y direction" where appropriate, and furthermore, the "−Y direction" and the "+Y direction" are collectively referred to as a "Y direction" where appropriate. Similarly, a starting point side in the Z axis is referred to as a "−Z direction" and an opposite side of the starting point side is referred to as a "+Z direction" where appropriate, and furthermore, the "−Z direction" and the "+Z direction" are collectively referred to as a "Z direction" where appropriate. Furthermore, although it is assumed that the X, Y, and Z axes orthogonally intersect with one another in the description below, it is not necessarily the case that units included in a mobile printer 1 serving as the mobile device M orthogonally intersect with one another.

Figure 1:
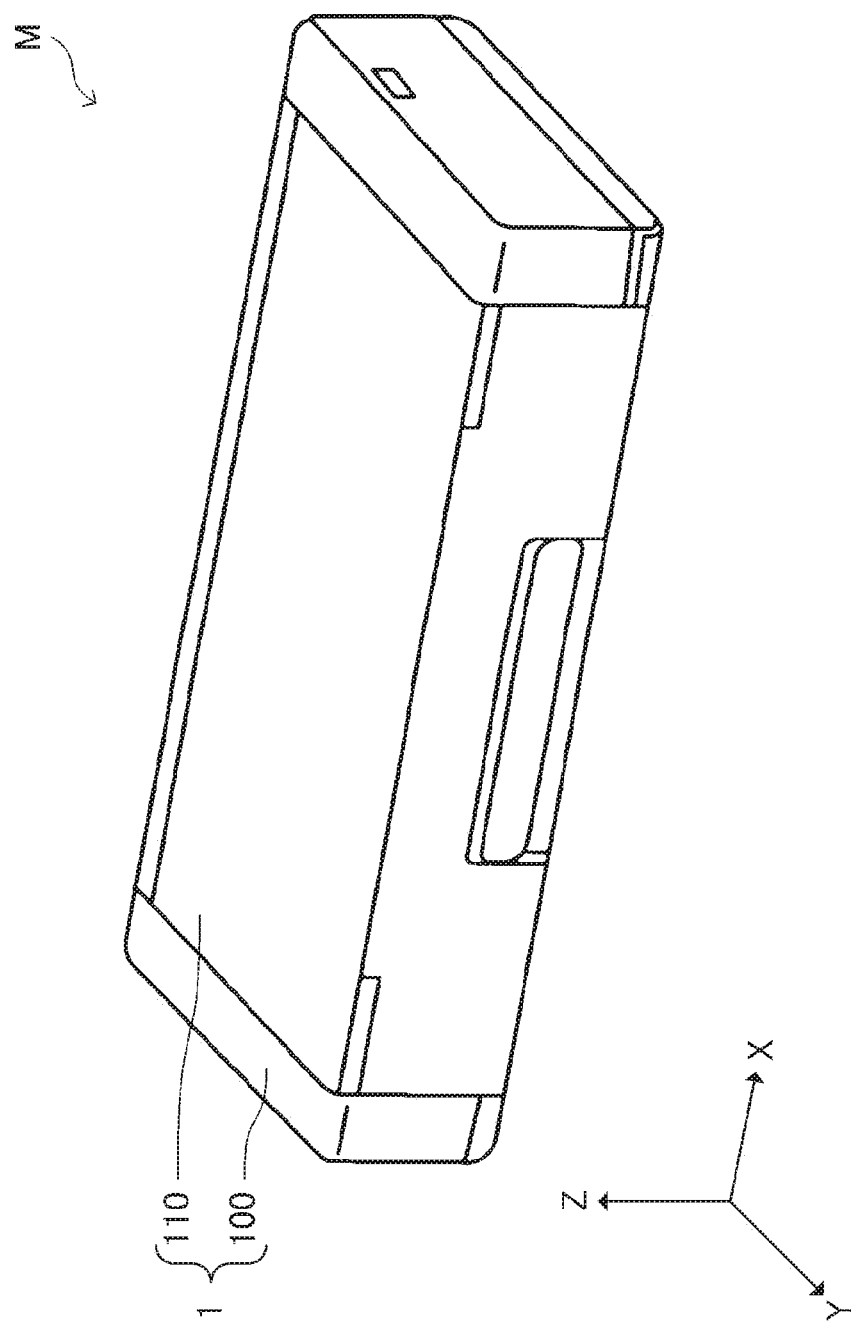
FIG. 1 is a diagram illustrating a mobile device viewed from a +Y direction.

FIG. 1 is a diagram illustrating the mobile device M viewed from the +Y direction. FIG. 2 is a diagram illustrating the mobile device M viewed from the +Y direction when a cover 110 of the mobile printer 1 as the mobile device M is opened. FIG. 3 is a diagram illustrating the mobile device M viewed from the −Y direction.

As illustrated in FIG. 1, the mobile printer 1 serving as the mobile device M includes a case 100 and the opening/closing cover 110 on an upper portion of the case 100.

Figure 2:
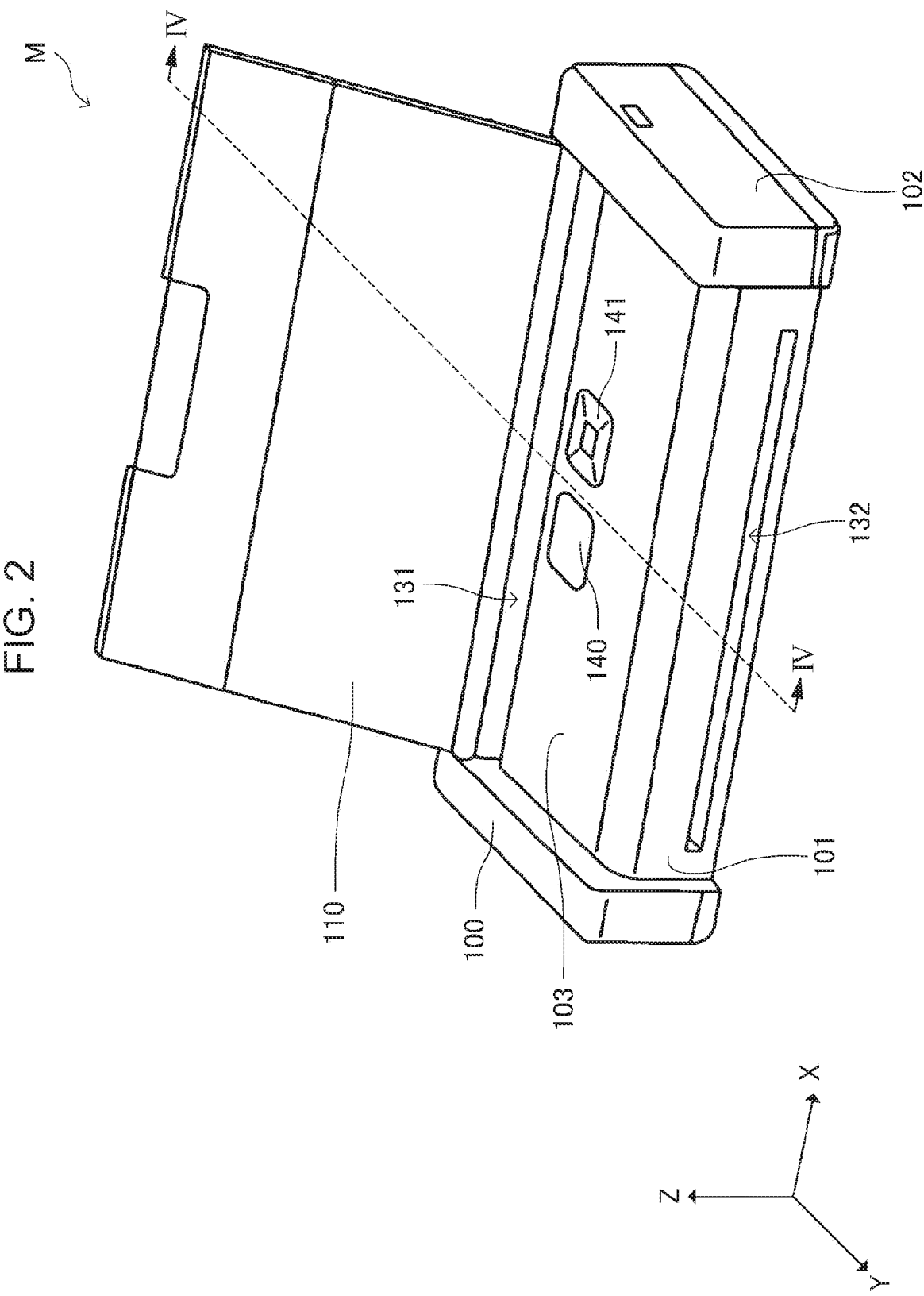
FIG. 2 is a diagram illustrating the mobile device viewed from the +Y direction when a cover of a mobile printer serving as the mobile device is opened.
Figure 3:
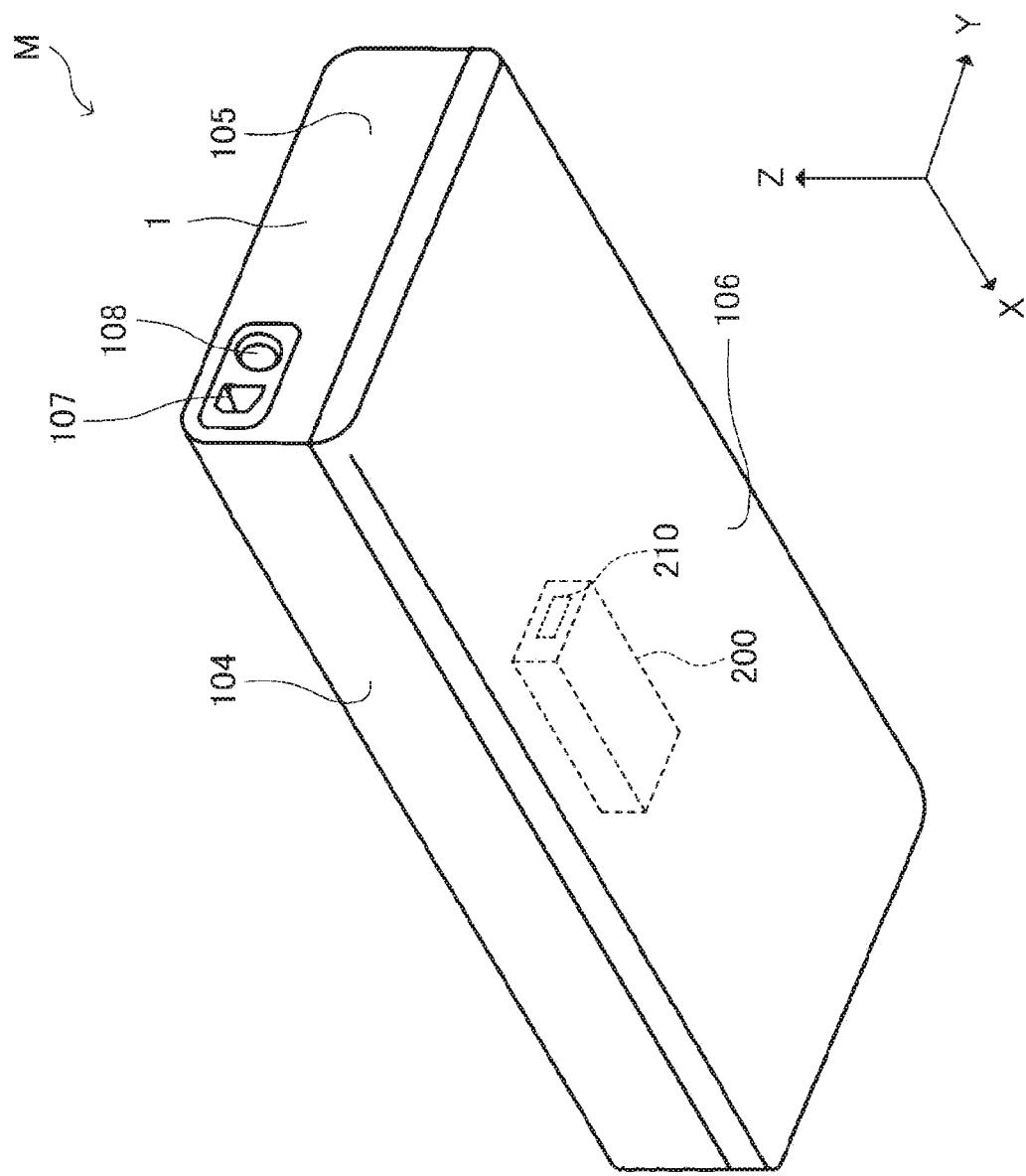
FIG. 3 is a diagram illustrating the mobile device viewed from a −Y direction.

As illustrated in FIGS. 2 and 3, the case 100 includes wall sections 101 to 106. The wall section 101 is positioned on the case 100 in the +Y direction. The wall section 102 is positioned on the case 100 in the +X direction. The wall section 103 is positioned on the case 100 in the +Z direction. The wall section 104 is positioned on the case 100 in the −Y direction. The wall section 105 is positioned on the case 100 in the −X direction. The wall section 106 is positioned on the case 100 in the −Z direction. Specifically, the wall section 101 and the wall section 104 face each other in the Y direction, the wall section 102 and the wall section 105 face each other in the X direction, and the wall section 103 and the wall section 106 face each other in the Z direction. That is, the case 100 of the mobile printer 1 is surrounded by the wall sections 101 to 106 and has a substantially rectangular parallelepiped shape having an internal space.

Furthermore, a display panel 140 and an operation switch 141 are disposed on the wall section 103 of the case 100. The display panel 140 displays information based on operations and states of the mobile printer 1. Note that the display panel 140 may be a liquid crystal panel, an electronic paper panel, or an organic electroluminescence panel. The operation switch 141 receives operations performed by a user. The mobile device M executes processes based on the operations performed on the operation switch 141. Note that the display panel 140 and the operation switch 141 disposed on the wall section 103 may be a touch panel formed by integrating the display panel 140 and the operation switch 141. The operation switch 141 is an example of an input section.

A supply port 131 used to supply media to an inside of the case 100 of the mobile printer 1 is disposed on the wall section 103 in the −Y direction. Furthermore, a discharge port 132 used to discharge the media supplied to the inside of the case 100 is disposed on the wall section 101. A medium supplied to the inside of the case 100 from the supply port 131 is transported in the case 100 and discharged from the discharge port 132. Furthermore, liquid is ejected to the medium while the medium is transported in the case 100. By this, an image based on the ejected liquid is formed on the medium to be discharged from the discharge port 132.

Furthermore, as illustrated in FIG. 3, the case 100 includes an accommodation section 200 accommodating a battery 20 described below and a connection section 210 electrically coupled to the battery 20 accommodated in the accommodation section 200. When the battery 20 is accommodated in the accommodation section 200, the battery 20 and the connection section 210 are electrically coupled to each other. By this, electric power based on a voltage output from the battery 20 is supplied to the mobile printer 1.

Specifically, the mobile printer 1 may operate based on the electric power supplied from the battery 20. The accommodation section 200 is an example of a first accommodation section.

As illustrated in FIG. 3, a direct current (DC) jack 108 to which a DC plug of an alternating current (AC) adapter, not illustrated, may be inserted and a universal serial bus (USB) port 107 to which a USB cable may be attached are disposed on the wall section 105. The mobile printer 1 is coupled to an external apparatus, such as a personal computer or a digital still camera, in a communication available manner through a USB cable coupled to the USB port 107. By this, image information Img is supplied from the external apparatus to the mobile printer 1. Furthermore, a voltage Vd is supplied to the mobile printer 1 through the DC jack 108. Specifically, the mobile printer 1 may be driven by electric power based on the voltage Vd which is supplied from the DC jack 108 and which serves as a power source voltage.

1.2 Internal Configuration of Case of Mobile Printer

Figure 4:
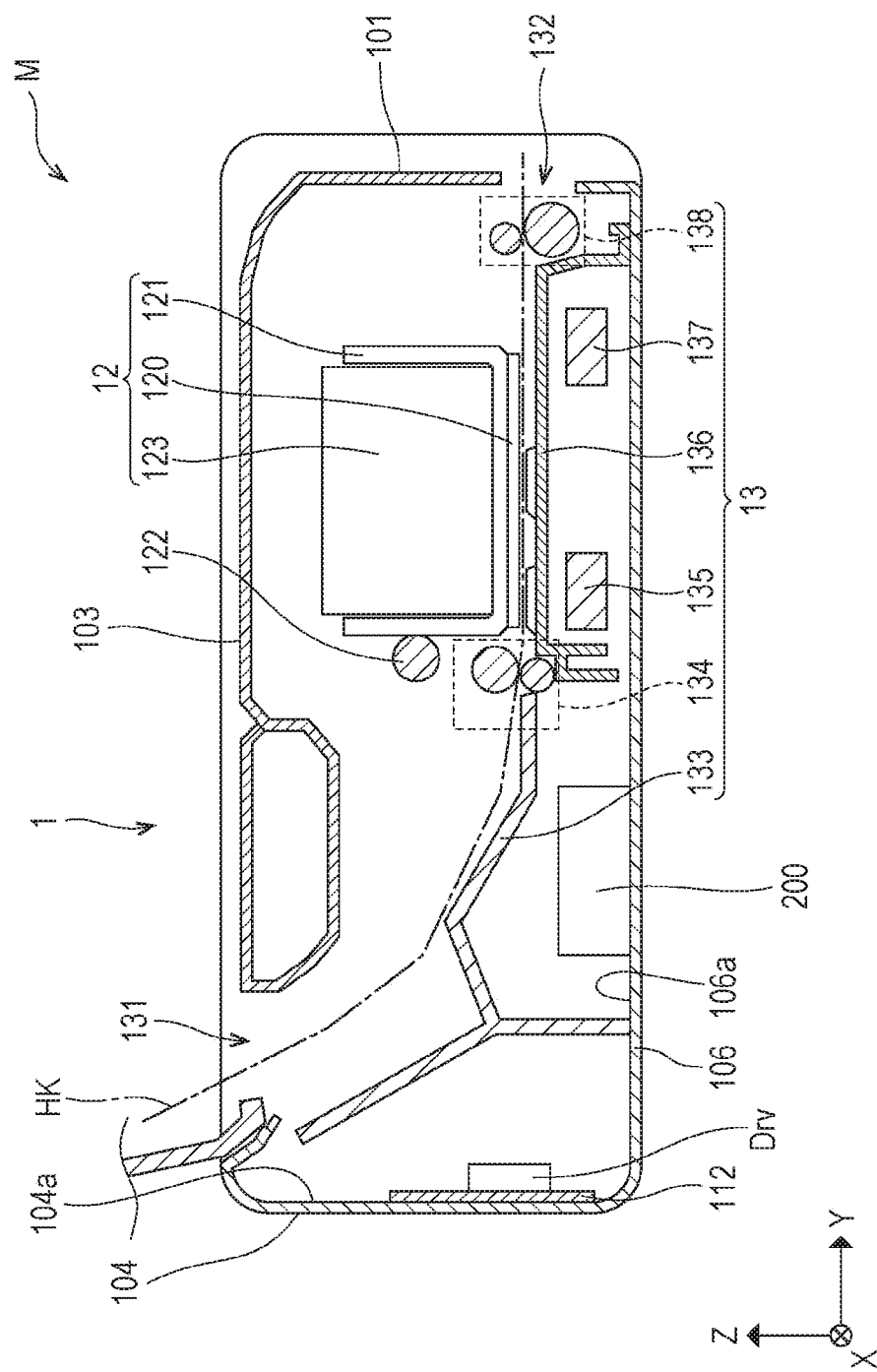
FIG. 4 is a cross-sectional view of the mobile device taken along a line IV to IV of FIG. 2.

Next, an internal configuration of the case 100 of the mobile printer 1 will be described. FIG. 4 is a cross-sectional view of the mobile device M taken along a line IV to IV in FIG. 2.

As illustrated in FIG. 4, the case 100 of the mobile printer 1 includes a head unit 12 and a transport unit 13.

The head unit 12 includes an ejection head 120, a carriage 121, and a liquid storage section 123. The carriage 121 is supported by a carriage guide shaft 122 extending in the X direction in a portion in the −Y direction in a reciprocation available manner. The carriage 121 reciprocates in the X direction while being supported by the carriage guide shaft 122. The ejection head 120 is disposed in a portion in the −Z direction of the carriage 121. Furthermore, the liquid storage section 123 which stores liquid to be ejected from the ejection head 120 is disposed on a portion in the +Z direction of the carriage 121. The liquid storage section 123 and the ejection head 120 are coupled to each other through a liquid flow path not illustrated. Specifically, the liquid stored in the liquid storage section 123 is supplied to the ejection head 120 through the liquid flow path not illustrated. Thereafter, the ejection head 120 ejects the supplied liquid.

The transport unit 13 includes a medium support section 133, a transport roller pair 134, a driving motor 135, a platen 136, a driving motor 137, and a transport roller pair 138. The medium support section 133 and the platen 136 form a transport path HK which transports a medium supplied from the supply port 131 to the discharge port 132. The medium supplied to the supply port 131 is transported from the medium support section 133 to the platen 136 when the transport roller pair 134 is driven. The platen 136 faces the ejection head 120 attached to the carriage 121 in the Z direction. While the medium is supported by the platen 136, liquid is ejected from the ejection head 120 and the liquid is landed on the medium so that an image is formed. Thereafter, the medium is transported to the discharge port 132 when the transport roller pair 138 is driven.

The transport roller pair 134 and the transport roller pair 138 used to transport the medium are controlled by driving of the driving motor 137. Furthermore, reciprocation of the carriage 121 is controlled by driving of the driving motor 135. Specifically, when the driving motor 135 and the driving motor 137 are controlled, the transport of the medium and a movement of the carriage 121 to which the ejection head 120 is attached are controlled. By this, a predetermined amount of liquid may be ejected to a desired portion on the medium, and accordingly, a desired image is formed on the medium.

A circuit substrate 112 including a plurality of circuits implemented thereon including a driving unit Drv outputting a control signal for operating the head unit 12 and the transport unit 13 is disposed in a portion in the −Y direction of the transport path HK. The circuit substrate 112 is attached to an inner surface 104a of the wall section 104 of the case 100. In other words, at least a portion of the driving unit Drv is in contact with the case 100. Since the driving unit Drv outputs a control signal to operate the head unit 12 and the transport unit 13, it is likely that the driving unit Drv consumes a larger amount of electric power when compared with the head unit 12 and the transport unit 13, and consequently, heat generated by the driving unit Drv may be higher than heat generated by the head unit 12 and heat generated by the transport unit 13. As illustrated in FIG. 4, since at least a portion of the driving unit Drv is in contact with the case 100, heat generated by the driving unit Drv is released through the case 100. Consequently, rise in temperature of the driving unit Drv may be reduced.

Furthermore, the accommodation section 200 is disposed in a portion on an inner surface 106a of the wall section 106 of the case 100 which is in the −Z direction of the transport path HK. Note that an opening/closing cover portion, not illustrated, for accommodating the battery 20 in the accommodation section 200 may be disposed in a contact section in which the accommodation section 200 and the wall section 106 are in contact with each other.

1.3 Functional Configuration of Mobile Printer

Figure 5:
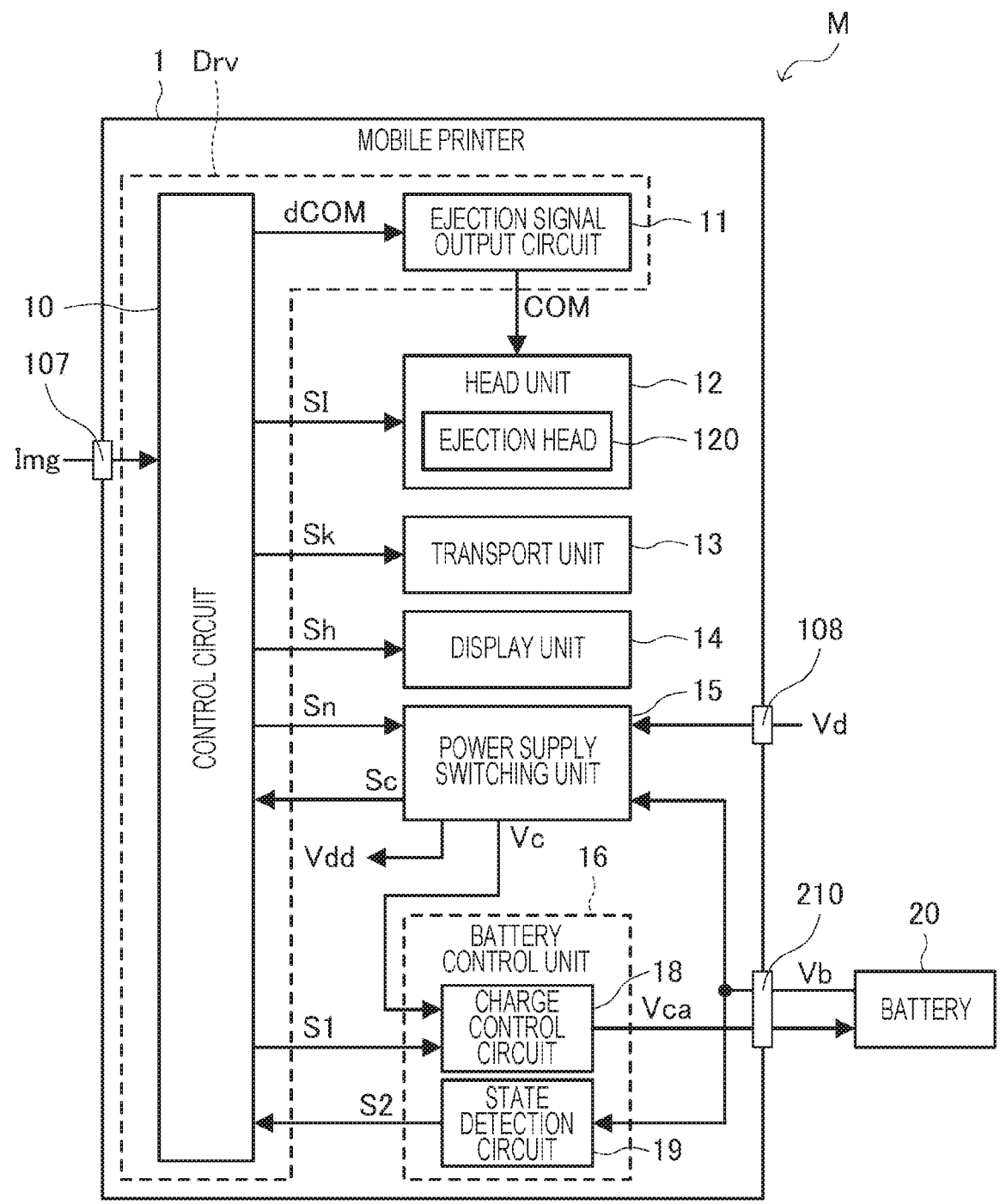
FIG. 5 is a diagram illustrating a functional configuration of the mobile device.

Here, a functional configuration of the mobile printer 1 will be described with reference to FIG. 5. FIG. 5 is a diagram illustrating a functional configuration of the mobile device M.

The mobile printer 1 includes at least one control circuit 10, an ejection signal output circuit 11, the head unit 12, the transport unit 13, a display unit 14, a power supply switching unit 15, and a battery control unit 16.

The control circuit 10 generates and outputs various control signals based on image information Img externally input through the USB port 107 so as to control operation of the mobile printer 1. The control circuit 10 includes a central processing unit (CPU), for example. Note that the control circuit 10 may include at least one of a digital signal processor (DSP), an application specific integrated circuit (ASIC), a programmable logic device (PLD), and a field programmable gate array (FPGA) instead of the CPU or in addition to the CPU.

The control circuit 10 generates a digital waveform prescribing signal dCOM for prescribing a waveform of an ejection signal COM to be output from the ejection signal output circuit 11 and outputs the waveform prescribing signal dCOM to the ejection signal output circuit 11. After converting the digital waveform prescribing signal dCOM into an analog signal, the ejection signal output circuit 11 performs class-D amplification on the converted analog signal to generate the ejection signal COM. Specifically, the digital waveform prescribing signal dCOM prescribes a waveform of the ejection signal COM, and the ejection signal output circuit 11 generates the ejection signal COM having a predetermined voltage value by performing the D-class amplification on the waveform prescribed by the waveform prescribing signal dCOM, and outputs the generated ejection signal COM to the head unit 12. Note that the waveform prescribing signal dCOM at least prescribes the waveform of the ejection signal COM and may be an analog signal. Furthermore, the ejection signal output circuit 11 at least amplifies the waveform prescribed by the waveform prescribing signal dCOM so as to obtain a predetermined voltage value and may include a class-A amplification circuit, a class-B amplification circuit, and a class-AB amplification circuit.

The control circuit 10 generates an ejection control signal SI for controlling ejection of liquid from a liquid ejection section not illustrated included in the ejection head 120 of the head unit 12 and outputs the generated ejection control signal SI to the head unit 12. The liquid ejection section included in the ejection head 120 includes a nozzle and a driving element to be used to eject liquid from the nozzle. The driving element is driven when the ejection signal COM is supplied. Thereafter, an amount of liquid corresponding to the driving of the driving element is ejected from the nozzle. Furthermore, the ejection head 120 controls supply of the ejection signal COM to the driving element based on the input ejection control signal SI. In this way, a predetermined amount of liquid is ejected from the nozzle included in the liquid ejection section of the ejection head 120 at a predetermined timing.

Furthermore, the control circuit 10 generates a transport control signal Sk to be output to the transport unit 13 so as to control the transport unit 13. The transport unit 13 transports a medium in a predetermined transport direction. A desired amount of liquid is ejected to a desired position of the medium when a timing when the transport unit 13 transports the medium based on the transport control signal Sk and a timing when the ejection head 120 ejects liquid based on the ejection control signal SI are synchronized with each other. In this way, a desired image is formed on the medium.

Furthermore, the control circuit 10 generates a display control signal Sh controlling display of various information in the display unit 14 and outputs the display control signal Sh in the display unit 14. The display unit 14 displays the various information including operation information and state information of the mobile device M in accordance with the display control signal Sh. By this, information including operation and states of the mobile device M is reported to the user. The display unit 14 includes the display panel 140, the operation switch 141, and a touch panel formed by integrating the display panel 140 and the operation switch 141 or the like as described above.

Furthermore, the control circuit 10 generates a power source selection signal Sn for controlling selection of a supply source supplying a power source voltage to drive the mobile printer 1 and outputs the power source selection signal Sn to the power supply switching unit 15. Furthermore, the power supply switching unit 15 determines whether the voltage Vd is supplied from an external power source, such as an AC adapter, generates a connection signal Sc based on a result of the determination, and outputs the connection signal Sc to the control circuit 10.

Specifically, a voltage Vb supplied from the battery 20 through the connection section 210 and the voltage Vd supplied from the AC adapter disposed outside the mobile device M through the DC jack 108 are supplied to the power supply switching unit 15. The power supply switching unit 15 selects one of the voltages Vb and Vd based on the power source selection signal Sn and supplies a selected one of the voltages Vb and Vd to the sections of the mobile printer 1 as a voltage Vdd serving as a power source voltage of the mobile printer 1.

Here, the voltage Vdd output from the power supply switching unit 15 is supplied to the various sections of the mobile printer 1 including the head unit 12, the transport unit 13, and the display unit 14. In other words, the head unit 12, the transport unit 13, and the display unit 14 are driven by electric power based on the voltage Vb supplied from the battery 20 or the voltage Vd supplied from the AC adapter. Specifically, the head unit 12, the transport unit 13, and the display unit 14 are examples of a driving circuit, and the battery 20 capable of supplying electric power to the head unit 12, the transport unit 13, and the display unit 14 is an example of a battery. Furthermore, the battery 20 is an all-solid-state battery having solid electrolyte in this embodiment. Accordingly, the battery 20 is also an example of a first battery according to the first embodiment. Note that, although the battery 20 is disposed outside the mobile printer 1 in FIG. 5, the battery 20 is disposed in the accommodation section 200 included in the mobile printer 1 in a detachable manner in practice.

Furthermore, the power supply switching unit 15 generates a connection signal Sc in accordance with a result of a determination as to whether the voltage Vd is supplied from the AC adapter. Then the power supply switching unit 15 outputs the connection signal Sc to the control circuit 10, and in addition, generates a voltage Vc for charging the battery 20 to be output to the battery control unit 16 when the voltage Vd is supplied from the AC adapter.

Figure 6:
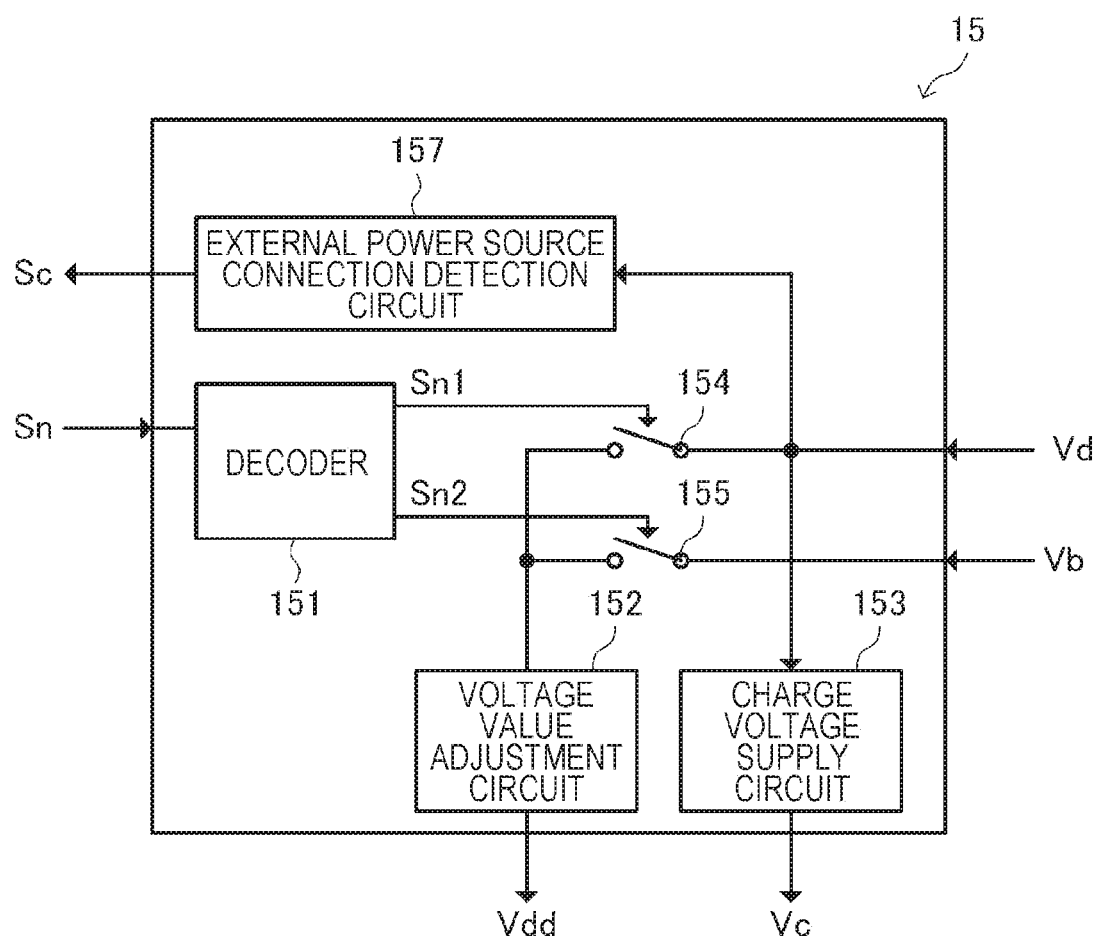
FIG. 6 is a diagram illustrating an example of a power supply switching unit.

Here, a configuration of the power supply switching unit 15 will be described in detail with reference to FIG. 6. FIG. 6 is a diagram illustrating an example of the power supply switching unit 15. The power supply switching unit 15 includes a decoder 151, a voltage value adjustment circuit 152, a charge voltage supply circuit 153, switches 154 and 155, and an external power source connection detection circuit 157.

The power source selection signal Sn is supplied to the decoder 151. The decoder 151 decodes the supplied power source selection signal Sn and outputs selection signals Sn1 and Sn2 of logical levels corresponding to the supplied power source selection signal Sn. For example, the power source selection signal Sn includes two-bit selection data [SnH, SnL], and when the selection data [SnH, SnL] is [0, 0] or [1, 1], the decoder 151 sets the logical levels of the selection signals Sn1 and Sn2 to be low. Furthermore, when the selection data [SnH, SnL] is [0, 1], the decoder 151 sets the logical levels of the selection signals Sn1 and Sn2 to a high level and a low level, respectively. When the selection data [SnH, SnL] is [1, 0], the decoder 151 sets the logical levels of the selection signals Sn 1 and Sn2 to be a low level and a high level, respectively.

The selection signal Sn1 is input to a control terminal of the switch 154. The selection signal Sn2 is input to a control terminal of the switch 155. The voltage Vd is supplied to an input terminal of the switch 154. The voltage Vb is supplied to an input terminal of the switch 155. Furthermore, output terminals of the switches 154 and 155 are electrically coupled to the voltage value adjustment circuit 152 after being coupled to each other in common. Each of the switches 154 and 155 brings the input terminal and the output terminal into a conductive state when the logical level of the signal supplied to the control terminal is in a high level and brings the input terminal and the output terminal into a non-conductive state when the logical level of the signal supplied to the control terminal is in a low level. Specifically, the switch 154 determines whether the voltage Vd is to be supplied to the voltage value adjustment circuit 152 based on the selection signal Sn1 and the switch 155 determines whether the voltage Vb is to be supplied to the voltage value adjustment circuit 152 based on the selection signal Sn2.

The voltage value adjustment circuit 152 increases or reduces the voltage value of the input voltage so as to convert the voltage value into a predetermined voltage value to be used to drive the mobile printer 1 and outputs a voltage Vdd.

Specifically, when the two-bit selection data [SnH, SnL] included in the power source selection signal Sn supplied to the power supply switching unit 15 is [0, 0] or [1, 1], the switches 154 and 155 are brought into a non-conductive state. Accordingly, a voltage is not supplied to the voltage value adjustment circuit 152, and as a result, the voltage Vdd is not output. Furthermore, when the two-bit selection data [SnH, SnL] included in the supplied power source selection signal Sn is [0, 1], the switch 154 is brought into a conductive state and the switch 155 is brought into a non-conductive state. Accordingly, the voltage Vd is supplied to the voltage value adjustment circuit 152. Consequently, the voltage value adjustment circuit 152 outputs the voltage Vdd based on the voltage Vd. Furthermore, when the two-bit selection data [SnH, SnL] included in the supplied power source selection signal Sn is [1, 0], the switch 155 is brought into a conductive state and the switch 154 is brought into a non-conductive state. Accordingly, the voltage Vb is supplied to the voltage value adjustment circuit 152. Consequently, the voltage value adjustment circuit 152 outputs the voltage Vdd based on the voltage Vb.

Furthermore, the power supply switching unit 15 includes the charge voltage supply circuit 153. The voltage Vd is supplied to the charge voltage supply circuit 153. Then the charge voltage supply circuit 153 generates and outputs a voltage Vc having a constant current value or a constant voltage value for charging the battery 20 based on the voltage Vd.

Furthermore, the power supply switching unit 15 includes the external power source connection detection circuit 157. The external power source connection detection circuit 157 detects a voltage value of the voltage Vd supplied from the AC adapter through the DC jack 108 so as to determine whether an external power source, such as the AC adapter, is coupled to the mobile printer 1. Thereafter, the external power source connection detection circuit 157 generates a connection signal Sc in accordance with a result of the determination and outputs the connection signal Sc to the control circuit 10. Specifically, the external power source connection detection circuit 157 is an example of a determination circuit determining whether electric power is supplied to the battery 20 by determining whether a voltage is supplied from the external power source to the mobile printer 1.

The control circuit 10 generates the power source selection signal Sn based on the supplied connection signal Sc and outputs the generated power source selection signal Sn to the power supply switching unit 15. By this, the power supply switching unit 15 may select the voltage Vd supplied from the AC adapter. When the power supply switching unit 15 selects the voltage Vd based on the power source selection signal Sn and outputs the voltage Vdd, the mobile printer 1 is driven by electric power in accordance with the voltage Vd supplied from the AD adapter.

Referring back to FIG. 5, the control circuit 10 generates a control signal S1 to control the battery control unit 16 and outputs the generated control signal S1 to the battery control unit 16. Furthermore, a state signal S2 is supplied from the battery control unit 16 to the control circuit 10.

The battery control unit 16 detects states of a charge control circuit 18 controlling charge of the battery 20 and a state detection circuit 19 which generates and outputs the state signal S2 indicating a result of the detection. The state detection circuit 19 detects a voltage value of the voltage Vb supplied from the battery 20, for example, as a state of the battery 20. By this, the state detection circuit 19 detects the battery 20 coupled to the connection section 210. Then, the state detection circuit 19 generates the state signal S2 indicating the state of the battery 20 in accordance with a result of the detection and outputs the state information S2 to the control circuit 10.

The control circuit 10 generates the power source selection signal Sn based on the supplied state signal S2 and outputs the generated power source selection signal Sn to the power supply switching unit 15. In this way, the power supply switching unit 15 may select the voltage Vd output from the battery 20. Since the power supply switching unit 15 selects the voltage Vb based on the power source selection signal Sn and outputs the voltage Vdd, the mobile printer 1 is driven by electric power in accordance with the voltage Vb supplied from the battery 20.

Furthermore, the state detection circuit 19 detects a voltage value of the voltage Vb supplied from the battery 20 and a temperature of the battery 20, for example, as a state of the battery 20, generates a state signal S2 indicating the state of the battery 20 in accordance with a result of the detection, and outputs the state signal S2 to the control circuit 10. In other words, the state detection circuit 19 obtains battery capacity and the temperature. The control circuit 10 determines whether the battery 20 is to be charged with reference to the detected voltage value of the voltage Vb and the detected temperature of the battery 20, generates a control signal S1 in accordance with a result of the determination, and outputs the control signal S1 to the charge control circuit 18. Thereafter, the charge control circuit 18 determines whether the voltage Vc supplied from the power supply switching unit 15 is to be output as a voltage Vca to be used to charge the battery 20 based on the input control signal S1. Here, the state detection circuit 19 is an example of a first obtaining circuit according to the first embodiment.

Furthermore, the control circuit 10 controls driving such that each of the sections included in the mobile printer 1 is driven in one of the plurality of modes including the normal mode and the restriction mode in which power is less consumed than the normal mode based on the connection signal Sc supplied from the external power source connection detection circuit 157 of the power supply switching unit 15 and the state signal S2 supplied from the state detection circuit 19 of the battery control unit 16.

Here, in the normal mode, when the mobile printer 1 is driven, a speed of ejection of the liquid from the head unit 12, a moving speed of the carriage 121, a transport speed of the medium, and the like are not particularly restricted to reduce power consumption. On the other hand, in the restriction mode, the speed of ejection of the liquid from the head unit 12, the moving speed of the carriage 121, the transport speed of the medium, display luminance of the display unit 14, and the like are restricted so that power consumption of the mobile printer 1 is reduced. Note that the power consumption of the mobile printer 1 in the normal mode and the power consumption of the mobile printer 1 in the restriction mode are different from each other and the difference between the normal mode and the restriction mode is not limited to presence or absence of the restriction of the functions described above. For example, a frequency of a clock signal specifying a control timing of the mobile printer 1 may be differentiated or a number of the functions of the mobile printer 1 may be disabled. Furthermore, a sleep mode may be forcibly entered under a predetermined condition as one of such control modes. Installation of a program in the mobile device M from an external server may not be permitted as one of such control modes. A line speed of the mobile device M for connection to the Internet may be reduced as one of such control modes. Note that the plurality of modes may include modes other than the normal mode and the restriction mode described above.

Here, a method for controlling the control circuit 10 will be described with reference to FIGS. 7 and 8.

Figure 7:
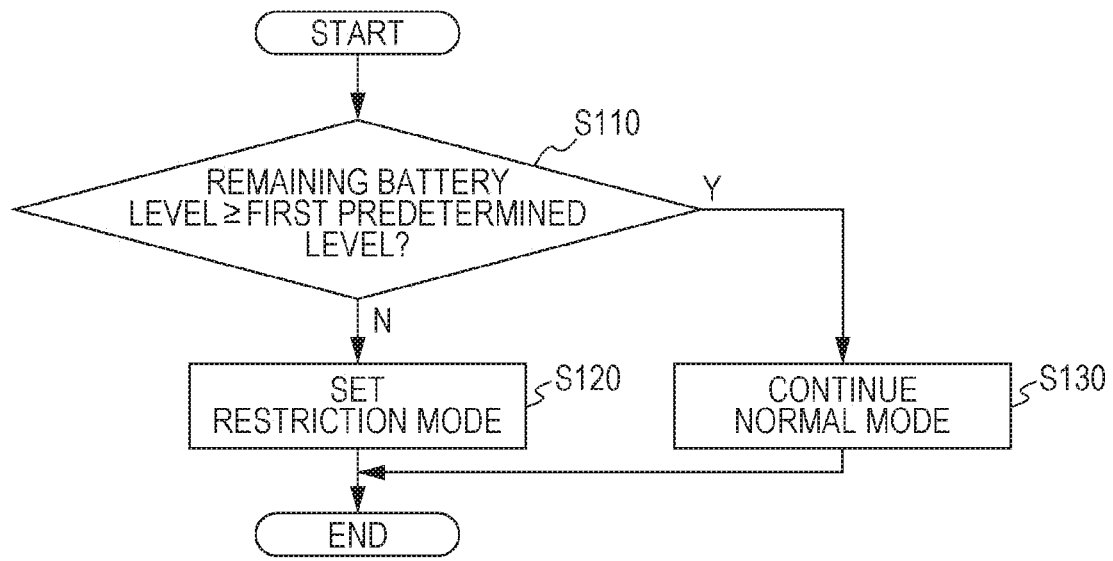
FIG. 7 is a flowchart of a method for causing the mobile printer to be driven in a restriction mode.

FIG. 7 is a diagram illustrating a method for causing the mobile printer 1 to be driven in the restriction mode which is employed in the control circuit 10 when the mobile printer 1 is driven in the normal mode.

When the sections in the mobile printer 1 are driven in the normal mode, the control circuit 10 detects a remaining battery level of the battery 20 based on the state signal S2 supplied from the state detection circuit 19. Thereafter, the control circuit 10 determines whether the remaining battery level of the battery 20 is equal to or larger than a first predetermined level based on the state signal S2 (S110). When the remaining battery level of the battery 20 is equal to or larger than the first predetermined level (Y in S110), the control circuit 10 performs control such that the sections included in the mobile printer 1 are driven in the normal mode. Specifically, the normal mode is continued (S130). On the other hand, when the remaining battery level of the battery 20 is not equal to or larger than the first predetermined level (N in S110), the control circuit 10 performs control such that the sections included in the mobile printer 1 are driven in the restriction mode. Specifically, the restriction mode is set (S120). In other words, in the mobile printer 1, the control circuit 10 performs switching from the normal mode to the restriction mode in accordance with a remaining battery level obtained by the state detection circuit 19. Accordingly, the first predetermined level corresponds to a state in which it is likely that the remaining battery level becomes 0 when the control circuit 10 is continuously driven in the normal mode, and is a comparatively small value. Assuming that a maximum value of the remaining battery level is 100%, the first predetermined level is 20%.

Figure 8:
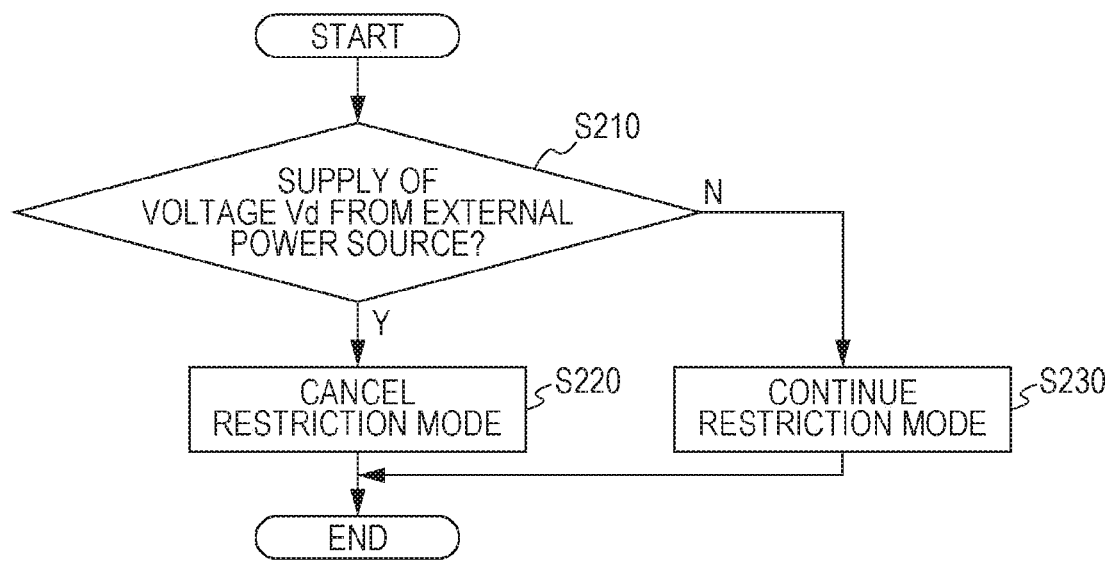
FIG. 8 is a flowchart of a method for causing the mobile printer to be driven in a normal mode.

FIG. 8 is a diagram illustrating a method for causing the mobile printer 1 to be driven in the normal mode which is employed in the control circuit 10 when the mobile printer 1 is driven in the restriction mode.

When the sections included in the mobile printer 1 are driven in the restriction mode, the control circuit 10 determines whether the voltage Vd is supplied from the external power source, such as the AC adapter, to the battery 20 accommodated in the mobile printer 1 based on the connection signal Sc supplied from the external power source connection detection circuit 157 of the power supply switching unit 15. In other words, when the sections of the mobile printer 1 are driven in the restriction mode, the control circuit 10 determines whether the voltage Vd is supplied from the external power source to the battery 20 accommodated in the mobile printer 1 based on the connection signal Sc (S210). When it is determined that the voltage Vd is supplied to the battery 20 (Y in S210), the control circuit 10 performs control such that the mobile printer 1 is driven in the normal mode. That is, the restriction mode is cancelled (S220). On the other hand, when it is determined that the voltage Vd is not supplied to the battery 20 (N in S210), the control circuit 10 performs control such that the sections included in the mobile printer 1 are driven in the restriction mode. Specifically, the restriction mode is continued (S230). In other words, in the mobile printer 1, when the external power source connection detection circuit 157 determines that electric power corresponding to the voltage Vd is supplied from the external power source, the control circuit 10 performs switching from the restriction mode to the normal mode.

As described above, in the mobile printer 1 serving as the mobile device M according to the first embodiment, modes of the sections included in the mobile printer 1 are switched from the normal mode to the restriction mode in accordance with a result of the determination as to whether the remaining battery level is equal to or larger than the predetermined threshold value. Subsequently, a mode of the driving of the mobile printer 1 is switched from the restriction mode to the normal mode in accordance with a result of the determination as to whether electric power is supplied from the external power source, such as the AC adapter, to the mobile printer 1.

Here, the normal mode is an example of a first mode according to the first embodiment, and the restriction mode is an example of a second mode according to the first embodiment.

1.4 Effects

As described above, in the mobile printer 1 serving as the mobile device M according to the first embodiment, charge of the battery 20 which is an all-solid-state battery having a solid electrolyte is started when the voltage Vd is supplied from the external power source, such as the AC adapter, to the mobile printer 1. In this case, the external power source connection detection circuit 157 determines whether electric power corresponding to the voltage Vd supplied from the external power source is supplied to the sections included in the mobile printer 1. When the external power source connection detection circuit 157 determines that the supply of the electric power to the mobile printer 1 is started in accordance with the voltage Vd, the control circuit 10 cancels the restriction mode in which the power consumption is small in the mobile printer 1 and sets the normal mode. Charge efficiency of the all-solid-state battery having a solid electrolyte is higher than charge efficiency of an electrolytic solution battery having a liquid electrolyte. Therefore, even when the mobile printer 1 enters the normal mode by supply of the voltage Vd from the external power source, such as the AC adapter, to the mobile printer 1 as a trigger, the battery 20 may store sufficient charge within a short time, and it is not likely that the restriction mode of the mobile device M is unnecessarily continued.

1.5 Modification 1.5.1 First Modification

Although the determination as to whether switching from the restriction mode to the normal mode of the mobile printer 1 is to be permitted is made based on a result of the determination as to whether the external power source, such as the AC adapter, is coupled to the mobile printer 1 serving as the mobile device M according to the first embodiment described above, the determination may be made based on an instruction issued by the user input by means of the operation switch 141 included in the display unit 14.

Specifically, when an instruction indicating that switching between a restriction mode and a normal mode is permitted is input from an operation switch 141 based on a result of a determination performed by an external power source connection detection circuit 157, a control circuit 10 performs switching from the restriction mode to the normal mode in accordance with a determination that the external power source supplies electric power made by the external power source connection detection circuit 157. On the other hand, when an instruction indicating that switching between the restriction mode and the normal mode is not permitted is input from the operation switch 141 based on a result of the determination performed by the external power source connection detection circuit 157, the control circuit 10 does not perform the switching from the restriction mode to the normal mode in accordance with the determination that the power source is supplied from the external power source made by the external power source connection detection circuit 157. In this case, the control circuit 10 may perform switching from the restriction mode to the normal mode in accordance with a remaining battery level of the battery 20 obtained by a state detection circuit 19.

Figure 9:
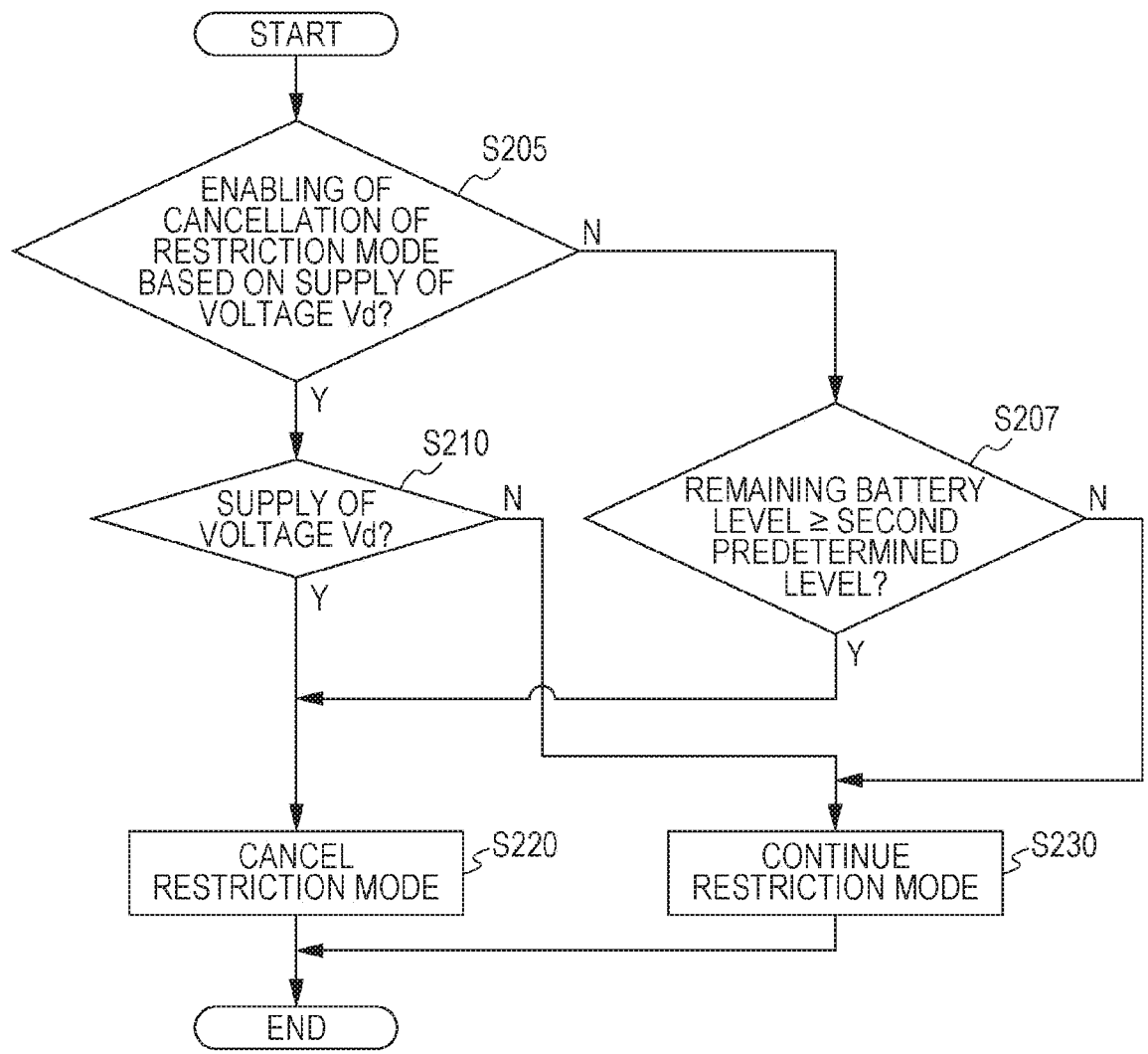
FIG. 9 is a flowchart of a method for causing a mobile printer to be driven in a normal mode according to a first modification.

FIG. 9 is a diagram illustrating a method for changing driving in the restriction mode of the mobile printer 1 to driving in the normal mode of the mobile printer 1 employed in the control circuit 10 according to a first modification.

The mobile printer 1 of the first modification may selectively enable or disable cancellation of the restriction mode performed when a voltage Vd is supplied from an external power source, such as an AC adapter, based on an operation performed by a user on the operation switch 141 (S205). When the cancellation of the restriction mode performed when the voltage Vd is supplied from the external power source, such as the AC adapter, is enabled by means of the operation performed by the user on the operation switch 141 (Y in S205), the control circuit 10 determines whether the AC adapter is coupled to the mobile printer 1 based on a connection signal Sc supplied from the external power source connection detection circuit 157 included in a power supply switching unit 15. In other words, the control circuit 10 determines whether the voltage Vd is supplied to the battery 20 accommodated in the mobile printer 1 from the external power source based on the connection signal Sc (S210). When it is determined that the voltage Vd is supplied to the battery 20 (Y in S210), the control circuit 10 performs control such that the mobile printer 1 is driven in the normal mode. That is, the restriction mode is cancelled (S220). On the other hand, when it is determined that the voltage Vd is not supplied to the battery 20 (N in S210), the control circuit 10 performs control such that sections included in the mobile printer 1 are driven in the restriction mode. Specifically, the restriction mode is continued (S230).

Furthermore, when the cancellation of the restriction mode performed when the voltage Vd is supplied from the external power source, such as the AC adapter, is not enabled based on the operation performed by the user on the operation switch 141 (N in S205), the control circuit 10 determines whether the remaining battery level of the battery 20 is equal to or larger than a second predetermined level based on a state signal S2 supplied from the state detection circuit 19 (S207). When the control circuit 10 determines that the remaining battery level of the battery 20 is equal to or larger than the second predetermined level (Y in S207), the control circuit 10 performs control such that the mobile printer 1 is driven in the normal mode. That is, the restriction mode is cancelled (S220). On the other hand, when the control circuit 10 determines that the remaining battery level of the battery 20 is not equal to or larger than the second predetermined level (N in S207), the control circuit 10 performs control such that the mobile printer 1 is driven in the restriction mode. Specifically, the restriction mode is continued (S230). In this way, the second predetermined level corresponds to a state in which the battery 20 charged to some extent still has a margin even when the control circuit 10 cancels the restriction mode and the mobile printer 1 is driven in the normal mode, and is a comparatively large value. Assuming that a maximum value of the remaining battery level is 100%, the second predetermined level is 60%.

In the mobile device configured as described above according to the first modification, a timing when the restriction mode is cancelled may be changed in accordance with a use environment of the user, the possibility that the restriction mode of the mobile device M is unnecessarily continued may be reduced, and versatility of the mobile device may be enhanced. That is, when the all-solid-state battery is used as described above, it is sufficient that the restriction mode is switched to the normal mode with supply of electric power to the battery 20 from the external power source as a trigger since the charge efficiency is high. However, the user may not desire cancellation of the restriction mode until a remaining battery level of the battery 20 becomes sufficient depending on a use state of the user. According to the first modification, the user may issue an instruction indicating that the switching performed when electric power is supplied to the battery 20 from the external power source is not permitted, and therefore, the mobile device may be generally used irrespective of a use state of the user.

1.5.2 Second Modification

When an all-solid-state battery having a solid electrolyte and an electrolytic solution battery having a liquid electrolyte may be mounted as the battery 20 on the mobile printer 1 serving as the mobile device M according to the first embodiment described above, the mobile printer 1 may change a timing when the restriction mode is switched to the normal mode in accordance with a type of battery mounted on the mobile printer 1.

Figure 10:
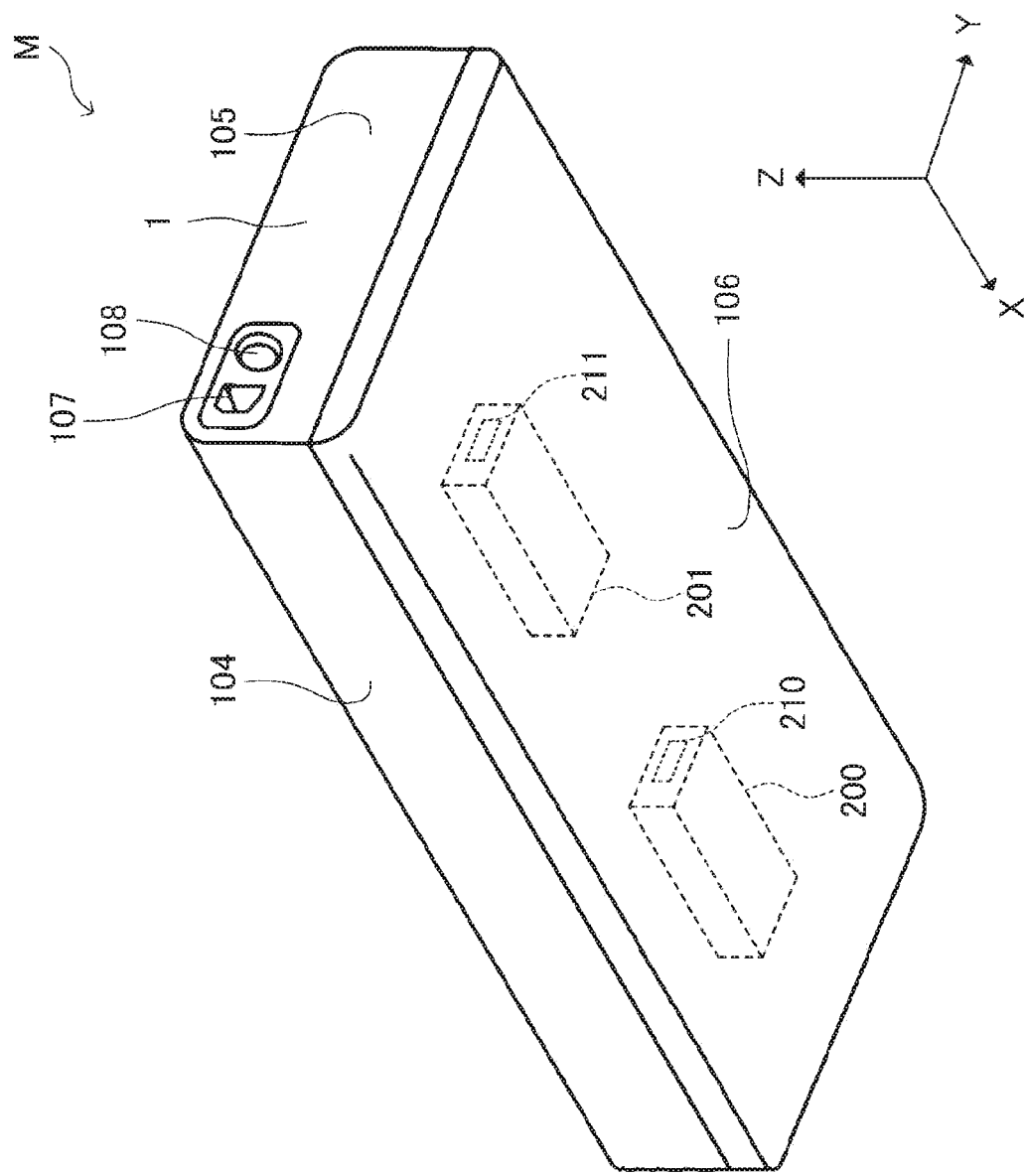
FIG. 10 is a diagram illustrating a mobile device viewed from a −Y direction according to a second modification.

FIG. 10 is a diagram illustrating a mobile device M viewed from a −Y direction according to a second modification. As illustrated in FIG. 10, a mobile printer 1 serving as the mobile device M according to the second modification includes two accommodation sections 200 and 201 accommodating a battery 20, a connection section 210 electrically coupled to the battery 20 when the battery 20 is accommodated in the accommodation section 200, and a connection section 211 electrically coupled to the battery 20 when the battery 20 is accommodated in the accommodation section 201. Here, the accommodation section 201 is an example of a second accommodation section.

Figure 11:
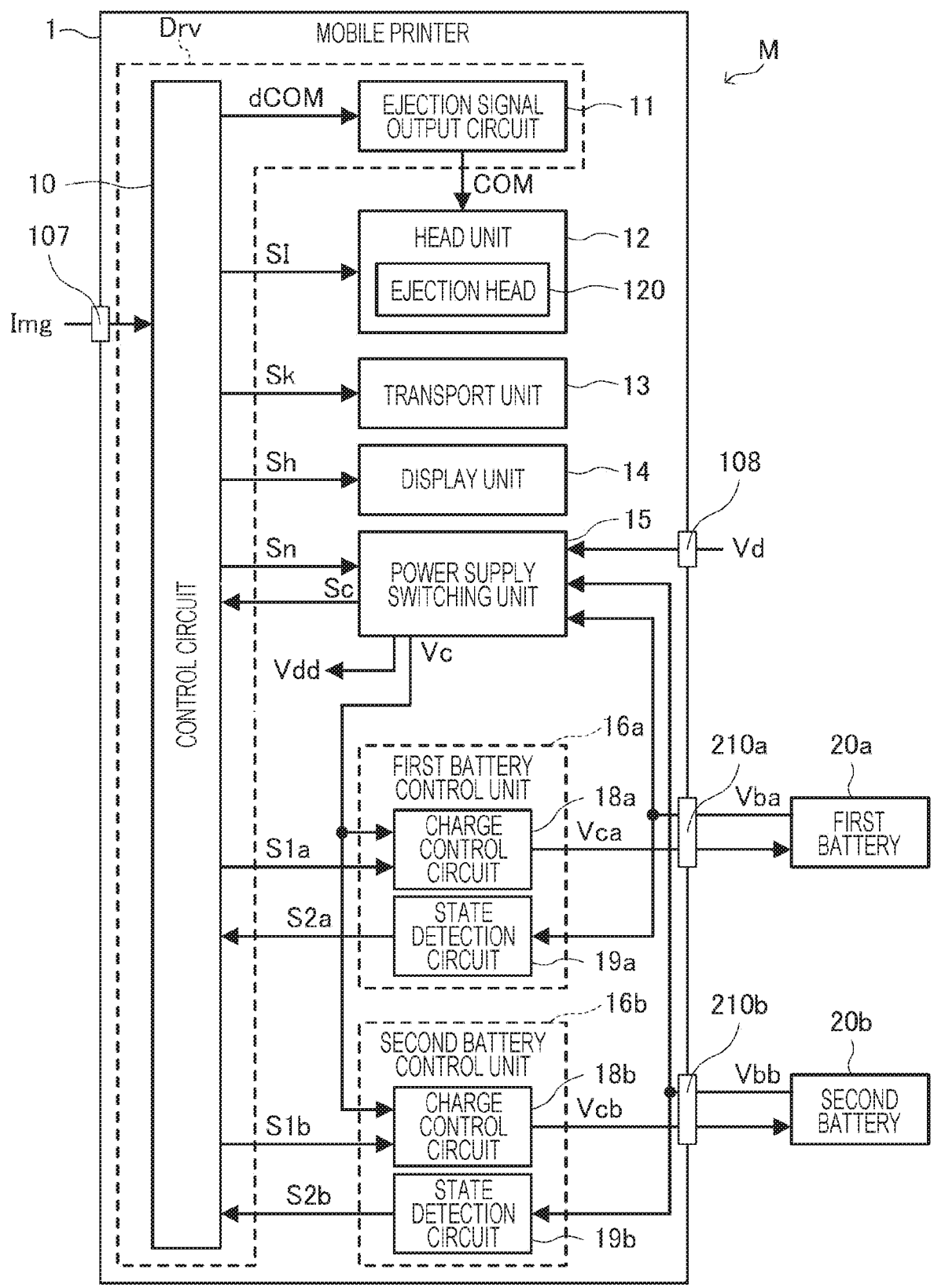
FIG. 11 is a diagram illustrating a functional configuration of the mobile device according to the second modification.

FIG. 11 is a diagram illustrating a functional configuration of the mobile device M according to the second modification. The mobile printer 1 serving as the mobile device M according to the second modification includes a first battery control unit 16*a* for a first battery 20*a* which is an example of the battery 20 accommodated in the accommodation section 200 and a second battery control unit 16*b* for a second battery 20*b* which is an example of the battery 20 accommodated in the accommodation section 201. It is assumed here that the first battery 20*a* is an all-solid-state battery having a solid electrolyte and the second battery 20*b* is an electrolyte battery having a liquid electrolyte. Furthermore, a voltage Vba supplied from the first battery 20*a*, a voltage Vbb supplied from the second battery 20*b*, and a voltage Vd supplied from an external power source are input to a power supply switching unit 15. The power supply switching unit 15 selects one of the voltages Vba, Vbb, and Vd to be output as a voltage Vdd.

As illustrated in FIG. 11, the control circuit 10 generates a control signal S1*a* to control the first battery control unit 16*a* and outputs the generated control signal S1*a* to the first battery control unit 16*a*. Furthermore, the first battery control unit 16*a* supplies a state signal S2*a* to the control circuit 10.

The first battery control unit 16*a* includes a charge control circuit 18*a* controlling charge of the first battery 20*a* and a state detection circuit 19a which detects a state of the first battery 20a and which generates and outputs the state signal S2a indicating a result of the detection. The state detection circuit 19a detects a voltage value of the voltage Vba supplied from the first battery 20a, for example, as a state of the first battery 20a. By this, the state detection circuit 19a detects connection of the first battery 20a to the connection section 210. The state detection circuit 19a generates the state signal S2a indicating a state of the first battery 20a in accordance with a result of the detection and outputs the state signal S2a to the control circuit 10. Note that, although the first battery 20a is disposed outside the mobile printer 1 in FIG. 11, the first battery 20a is disposed in a detachable manner in the accommodation section 200 incorporated in the mobile printer 1 in practice.

The control circuit 10 generates a power source selection signal Sn based on the supplied state signal S2a and outputs the power source selection signal Sn to the power supply switching unit 15. By this, the power supply switching unit 15 may select the voltage Vba supplied from the first battery 20a. The power supply switching unit 15 selects the voltage Vba based on the power source selection signal Sn and outputs a voltage Vdd, and therefore, the mobile printer 1 is driven by electric power based on the voltage Vba supplied from the first battery 20a.

Furthermore, the state detection circuit 19a detects a voltage value of the voltage Vba supplied from the first battery 20a and a temperature of the first battery 20a, for example, as a state of the first battery 20a, generates a state signal S2a indicating the state of the first battery 20a in accordance with a result of the detection, and outputs the state signal S2a to the control circuit 10, for example. In other words, the state detection circuit 19a obtains battery capacity and the temperature of the first battery 20a. The control circuit 10 determines whether the first battery 20a is to be charged with reference to the detected voltage value of the voltage Vba and the detected temperature of the first battery 20a, generates a control signal S1a in accordance with a result of the determination, and outputs the control signal S1a to the charge control circuit 18a. Thereafter, the charge control circuit 18a determines whether a voltage Vc supplied from the power supply switching unit 15 is to be output as a voltage Vca used to charge the first battery 20a based on the control signal S1a. Here, the state detection circuit 19a is an example of a first obtaining circuit according to the second modification of the first embodiment.

The control circuit 10 outputs a control signal S1b used to control the second battery control unit 16b and outputs the control signal S1b to the second battery control unit 16b. Furthermore, the second battery control unit 16b supplies a state signal S2b to the control circuit 10.

The second battery control unit 16b includes a charge control circuit 18b controlling charge of the second battery 20b and a state detection circuit 19b which detects a state of the second battery 20b and which generates and outputs a state signal S2b indicating a result of the detection. The state detection circuit 19b detects a voltage value of a voltage Vbb supplied from the second battery 20b, for example, as a state of the second battery 20b. By this, the state detection circuit 19b detects connection of the second battery 20b to the connection section 211. Then, the state detection circuit 19b generates a state signal S2b indicating a state of the battery 20b in accordance with a result of the detection and outputs the state signal S2b to the control circuit 10. Note that, although the second battery 20b is disposed outside the mobile printer 1 in FIG. 11, the second battery 20b is disposed in a detachable manner in the accommodation section 201 incorporated in the mobile printer 1 in practice.

The control circuit 10 generates a power source selection signal Sn based on the supplied state signal S2b and outputs the power source selection signal Sn to the power supply switching unit 15. By this, the power supply switching unit 15 may select the voltage Vbb supplied from the second battery 20b. The power supply switching unit 15 selects the voltage Vbb based on the power source selection signal Sn and outputs a voltage Vdd, and therefore, the mobile printer 1 is driven by electric power based on the voltage Vbb supplied from the second battery 20b.

Furthermore, the state detection circuit 19b detects a voltage value of the voltage Vbb supplied from the second battery 20b and a temperature of the second battery 20b, for example, as a state of the second battery 20b, generates a state signal S2b indicating a state of the second battery 20b in accordance with a result of the detection, and outputs the state signal S2b to the control circuit 10. In other words, the state detection circuit 19b obtains battery capacity and the temperature of the second battery 20b. The control circuit 10 determines whether the second battery 20b is to be charged with reference to the detected voltage value of the voltage Vbb and the detected temperature of the first battery 20b, generates a control signal S1b in accordance with a result of the determination, and outputs the control signal S1b to the charge control circuit 18b. Thereafter, the charge control circuit 18b determines whether the voltage Vc supplied from the power supply switching unit 15 is to be output as a voltage Vcb used to charge the second battery 20b based on the control signal S1b. Here, the state detection circuit 19b is an example of a second obtaining circuit according to the second modification of the first embodiment.

Then, the control circuit 10 determines whether each of the sections included in the mobile printer 1 is to be driven in the normal mode or in the restriction mode in which power consumption is smaller than the normal mode based on the connection signal Sc output from the external power source connection detection circuit 157 of the power supply switching unit 15, the state signal S2a output from the state detection circuit 19a of the first battery control unit 16a, and the state signal S2b output from the state detection circuit 19b of the second battery control unit 16b.

Figure 12:
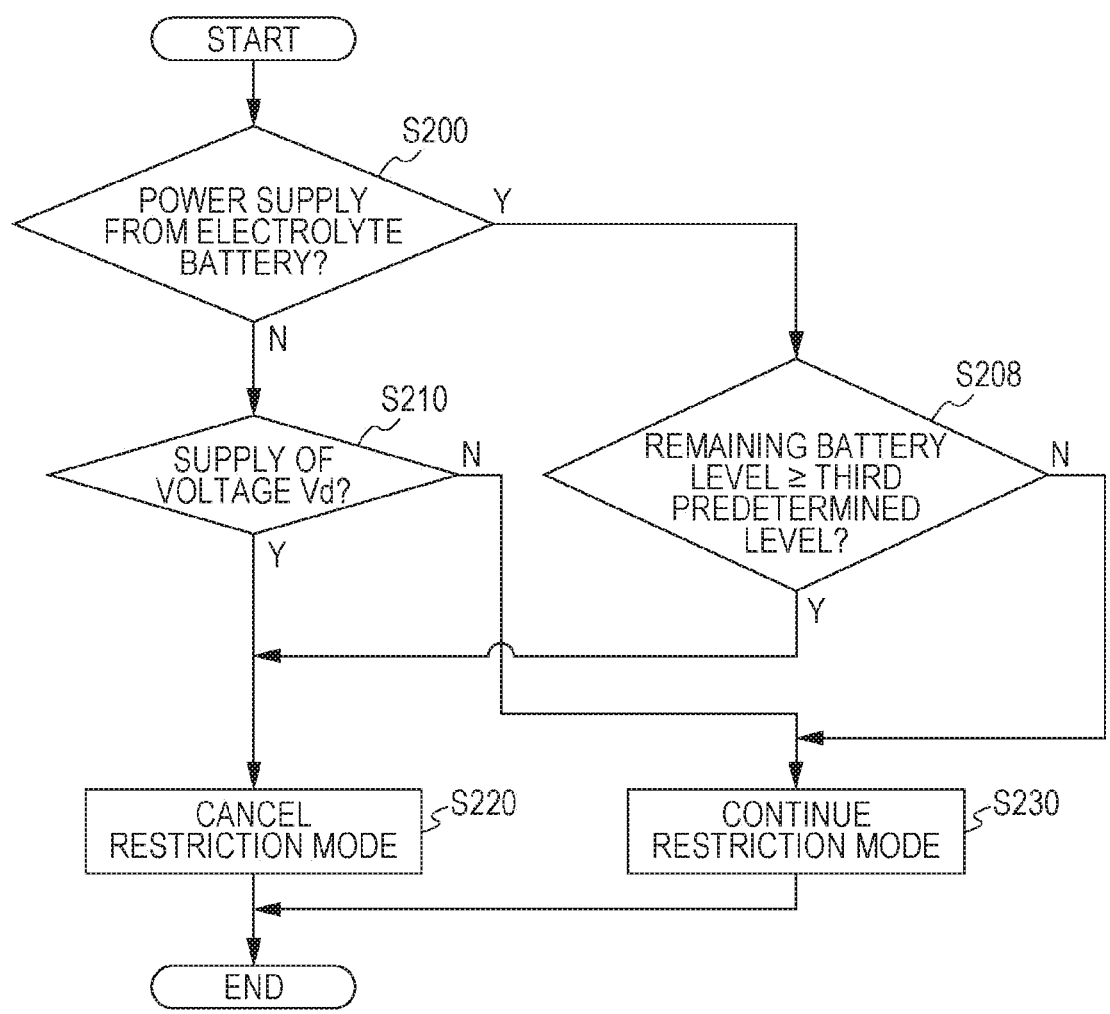
FIG. 12 is a flowchart of a method for causing a mobile printer to be driven in a normal mode according to the second modification.

FIG. 12 is a diagram illustrating a method for changing driving in the restriction mode of the mobile printer 1 to driving in the normal mode of the mobile printer 1 employed in the control circuit 10 according to the second modification.

The control circuit 10 determines whether electric power is supplied to the sections included in the mobile printer 1 in accordance with the voltage Vbb supplied from the second battery 20b serving as the electrolytic solution battery (S200). When the supply of the electric power to the sections included in the mobile printer 1 is not performed in accordance with the voltage Vbb supplied from the second battery 20b serving as the electrolytic solution battery (N in S200), the control circuit 10 determines whether the external power source, such as the AC adapter, is coupled to the mobile printer 1 based on the connection signal Sc supplied from the external power source connection detection circuit 157 of the power supply switching unit 15. In other words, the control circuit 10 determines whether the external power source supplies the voltage Vd to the first battery 20a of the mobile printer 1 based on the connection signal Sc (S210). When it is determined that the external power source supplies the voltage Vd to the first battery 20a of the mobile printer 1 (Y in S210), the control circuit 10 performs control such that the mobile printer 1 is driven in the normal mode. That is, the restriction mode is cancelled (S220). On the other hand, when it is determined that the external power source does not supply the voltage Vd to the first battery 20*a* included in the mobile printer 1, the control circuit 10 performs control such that the sections included in the mobile printer 1 are driven in the restriction mode. That is, the restriction mode is continued (S230).

Furthermore, when the supply of the electric power to the sections included in the mobile printer 1 is performed in accordance with the voltage Vbb supplied from the second battery 20*b* serving as the electrolytic solution battery (Y in S200), the control circuit 10 determines whether a remaining battery level of the second battery 20*b* is equal to or larger than a third predetermined level based on the state signal S2*b* supplied from the state detection circuit 19 (S208). When the control circuit 10 determines that the remaining battery level of the battery 20*b* is equal to or larger than the third predetermined level (Y in S208), the control circuit 10 performs control such that the mobile printer 1 is driven in the normal mode. That is, the restriction mode is cancelled (S220). On the other hand, when the control circuit 10 determines that the remaining battery level of the second battery 20*b* is not equal to or larger than the third predetermined level (N in S208), the control circuit 10 performs control such that the sections of the mobile printer 1 are driven in the restriction mode. That is, the restriction mode is continued (S230). In this way, the third predetermined level corresponds to a state in which the second battery 20*b* which is the electrolytic solution battery is charged to some extent and still has a margin even when the control circuit 10 cancels the restriction mode and the mobile printer 1 is driven in the normal mode and is a comparatively large value. Assuming that a maximum value of the remaining battery level is 100%, the third predetermined level is 80%. Here, the third predetermined level is larger than the second predetermined level. Since the electrolytic solution battery has a battery consumption rate larger than that of the all-solid-state battery, the third predetermined level is larger than the second predetermined level.

In the mobile device configured as described above according to the second modification, in a case where electric power to drive the mobile printer 1 corresponds to the voltage Vbb supplied from the second battery 20*b* which is the electrolytic solution battery having low charge efficiency, when a remaining battery level of the second battery 20*b* is not equal to or larger than the third predetermined level, the restriction mode is not cancelled even when the external power source, such as the AC adapter, supplies the voltage Vd to the mobile printer 1. In other words, in a case where the mobile printer 1 is driven by electric power corresponding to the voltage Vbb supplied from the second battery 20*b* which is the electrolytic solution battery, the mobile printer 1 is continuously driven in the restriction mode in which the power consumption is low even when the external power source supplies the voltage Vd to the mobile printer 1. By this, even when the external power source supplies the voltage Vd to the mobile printer 1, the second battery 20*b* may be charged by the voltage Vd and the charge efficiency of the second battery 20*b* may be enhanced. Accordingly, a period of time in which the mobile device M is in the restriction mode may be appropriately determined. Consequently, the possibility that the restriction mode of the mobile device M is unnecessarily continued may be further reduced, and in addition, versatility of the mobile device may be enhanced since the first battery 20*a* which is the all-solid-state battery and the second battery 20*b* which is the electrolytic solution battery may be used in combination.

2. Second Embodiment

As a mobile device according to a second embodiment, a smartphone which is a display device displaying various information on a display panel and which may be operated by a battery will be described as an example. Note that, in the description of the mobile device according to the second embodiment, the same components are denoted by the same reference numerals and detailed descriptions thereof are omitted or simplified.

Figure 13:
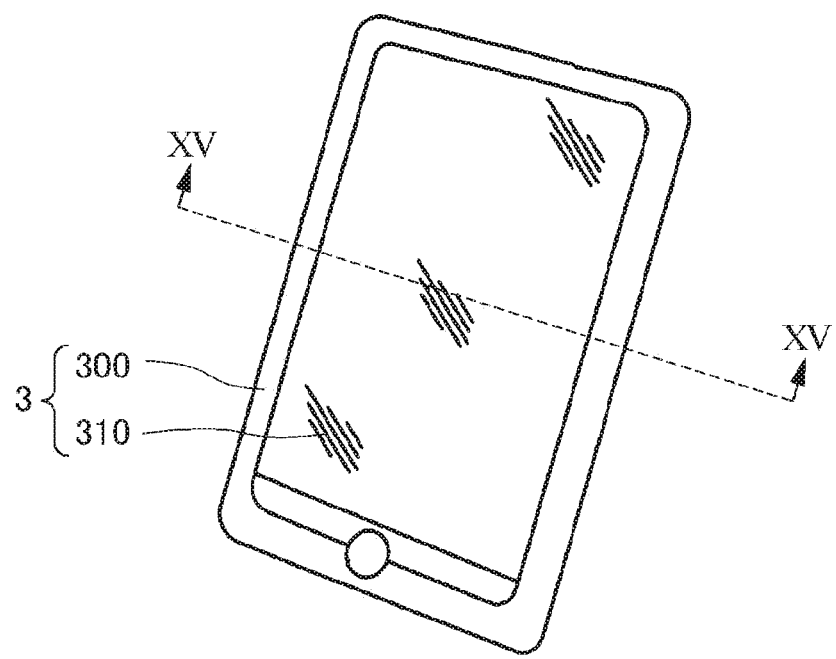
FIG. 13 is a front view of a mobile device according to a second embodiment.
Figure 14:
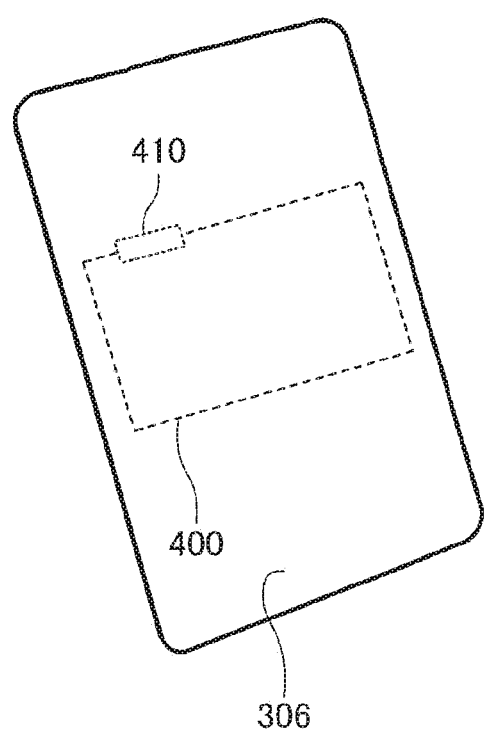
FIG. 14 is a back view of the mobile device according to the second embodiment.
Figure 15:
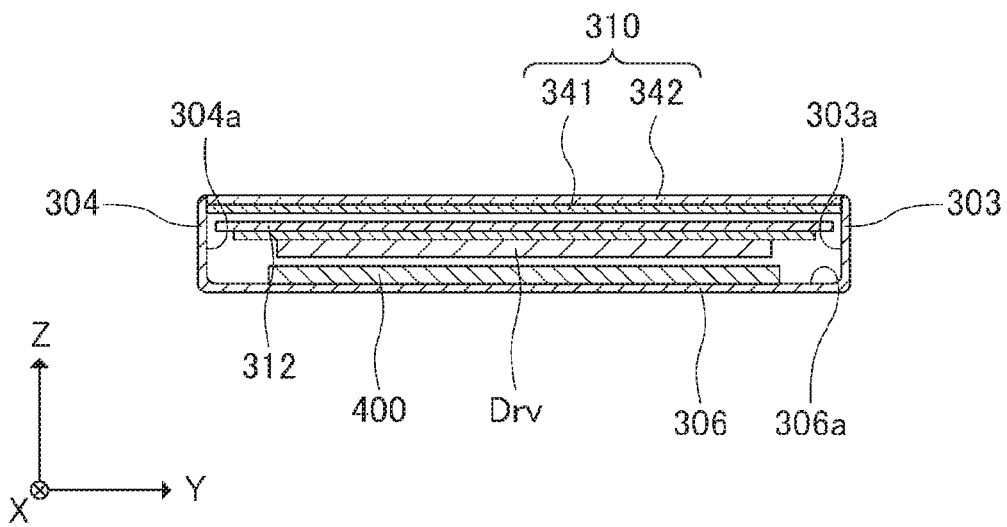
FIG. 15 is a cross-sectional view of the mobile device taken along a line XV to XV of FIG. 13 according to the second embodiment.

FIGS. 13 to 15 are diagrams illustrating a configuration of a smartphone 3 serving as a mobile device M. Note that X, Y, and Z axes are orthogonally intersect with one another in the description below. A starting point side in the X axis is referred to as a "−X direction" and an opposite side of the starting point side is referred to as a "+X direction" where appropriate, and furthermore, the "−X direction" and the "+X direction" are collectively referred to as an "X direction" where appropriate. Similarly, a starting point side in the Y axis is referred to as a "−Y direction" and an opposite side of the starting point side is referred to as a "+Y direction" where appropriate, and furthermore, the "−Y direction" and the "+Y direction" are collectively referred to as a "Y direction" where appropriate. Similarly, a starting point side in the Z axis is referred to as a "−Z direction" and an opposite side of the starting point side is referred to as a "+Z direction" where appropriate, and furthermore, the "−Z direction" and the "+Z direction" are collectively referred to as a "Z direction" where appropriate. Note that, although it is assumed that the X, Y, and Z axes orthogonally intersect with one another in the description below, it is not necessarily the case that units included in the smartphone 3 serving as the mobile device M orthogonally intersect with one another.

FIG. 13 is a front view of the mobile device M according to the second embodiment. FIG. 14 is a back view of the mobile device M according to the second embodiment. FIG. 15 is a cross-sectional view of the mobile device M taken along a line XV to XV of FIG. 13 according to the second embodiment.

As illustrated in FIG. 13, the smartphone 3 serving as the mobile device M includes a case 300 and a display panel 310. Furthermore, as illustrated in FIG. 14, the smartphone 3 includes an accommodation section 400 accommodating a battery 20 which is an all-solid-state battery having solid electrolyte and a connection section 410 electrically coupled to the battery 20 accommodated in the accommodation section 400.

As illustrated in FIGS. 13 to 15, the case 300 includes wall sections 303, 304, and 306, that is, one surface of the case 300 is open. The wall section 306 faces the open surface which is an open side of the case 300. The wall section 303 is located in a portion in the +Y direction of the case 300. The wall section 304 is located in a portion in the −Y direction of the case 300. Furthermore, although not illustrated in FIGS. 13 to 15, the case 300 has wall sections facing each other in the X direction. Specifically, the case 300 has a substantially rectangular parallelepiped shape having the open surface.

Furthermore, the display panel 310 is disposed on the open surface facing the wall section 306 in the Z direction. The display panel 310 includes a display section 341 and a sensor section 342 laminated on the display section. Note that the section 341 is constituted by a liquid crystal panel, an electronic paper panel, or an organic electroluminescence panel. Furthermore, the sensor section 342 functions as an operation section which receives a user operation. Examples of the sensor section 342 include a resistive film sensor, an electrostatic capacitance sensor, and a surface acoustic wave sensor. That is, the display panel 310 of this embodiment is a so-called touch panel configured by integrating the display section 341 with the sensor section 342 corresponding to an operation switch.

As described above, the display panel 310, a driving unit Drv, and the accommodation section 400 are disposed on the case 300 of the smartphone 3 serving as a mobile device M according to the second embodiment.

Specifically, as illustrated in FIG. 15, the accommodation section 400 accommodating a fixed battery 20 is disposed such that the accommodation section 400 is in contact with an inner surface 306a of the wall section 306 of the case 300. Furthermore, an openable cover portion not illustrated may be disposed on the wall section 306 being in contact with the accommodation section 400. A circuit substrate 312 in which the driving unit Drv is implemented is positioned on the accommodation section 400 in the +Z direction and the display panel 310 is positioned on the circuit substrate 312 in the +Z direction.

Figure 16:
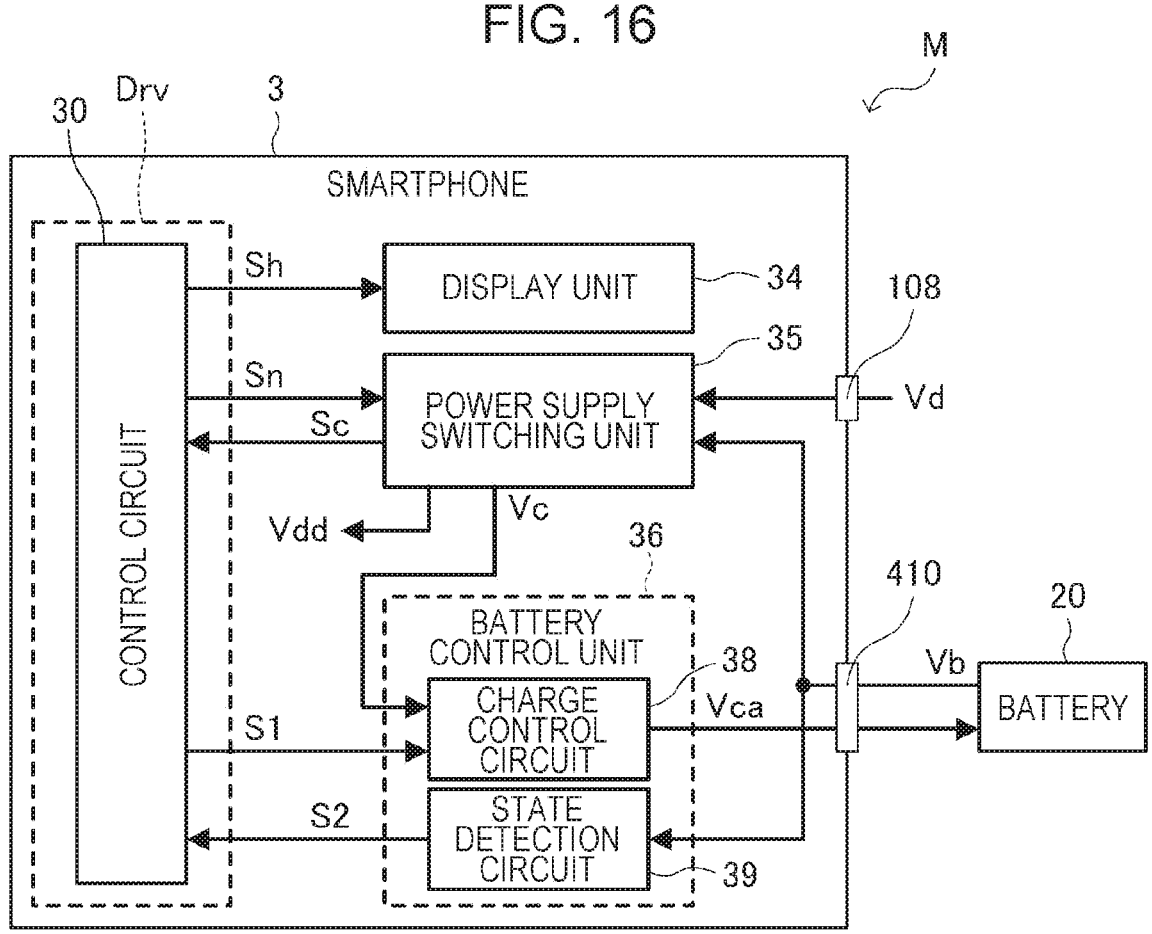
FIG. 16 is a diagram illustrating a functional configuration of the mobile device according to the second embodiment.

FIG. 16 is a diagram illustrating a functional configuration of the mobile device M according to the second embodiment. As illustrated in FIG. 16, the smartphone 3 serving as the mobile device M includes a control circuit 30, a display unit 34, a power supply switching unit 35, and a battery control unit 36.

The control circuit 30 which generates and outputs various control signals controlling driving of the smartphone 3 includes a CPU, for example. Note that the control circuit 30 may include at least one of a DSP, an ASIC, a PLD, and an FPGA instead of the CPU or in addition to the CPU.

The control circuit 10 generates a display control signal Sh for controlling display of various information in the display unit 34 and outputs the generated display control signal Sh to the display unit 34. The display unit 34 displays the various information including operation information and state information of the mobile device M in accordance with the display control signal Sh. By this, information including operation and states of the mobile device M is reported to the user. Here, the display unit 34 includes the display panel 310 described above. The display unit 34 is an example of a driving circuit according to the second embodiment.

Furthermore, the control circuit 10 generates a power source selection signal Sn for controlling selection of a supply source of a power source voltage to be supplied to the smartphone 3 and outputs the generated power source selection signal Sn to the power supply switching unit 35. A voltage Vb supplied from the battery 20 through a connection section 410 and a voltage Vd supplied from an AC adapter disposed outside the mobile device M through a DC jack 108 are supplied to the power supply switching unit 35. The power supply switching unit 35 selects one of the voltages Vb and Vd based on the power source selection signal Sn and supplies a selected one of the voltages Vb and Vd to the sections of the smartphone 3 as a voltage Vdd serving as a power source voltage of the smartphone 3. Furthermore, the power supply switching unit 35 determines whether the voltage Vd is supplied from the AC adapter through the DC jack 108, generates a connection signal Sc based on a result of the determination, outputs the connection signal Sc to the control circuit 10, generates a voltage Vc for charging the battery 20 based on the voltage Vd, and outputs the generated voltage Vc to the battery control unit 36. Note that the power supply switching unit 35 has the same configuration as the power supply switching unit 15 according to the first embodiment, and therefore, a detailed description thereof is omitted.

Furthermore, the control circuit 30 generates a control signal S1 for controlling the battery control unit 36 and outputs the generated control signal S1 to the battery control unit 36. Furthermore, a state signal S2 is supplied from the battery control unit 36 to the control circuit 30.

The battery control unit 36 detects states of a charge control circuit 38 controlling charge of the battery 20 and a state detection circuit 39 which detects a state of the battery 20 and which generates and outputs the state signal S2 indicating a result of the detection. The state detection circuit 39 detects a voltage value of the voltage Vb supplied from the battery 20, for example, as a state of the battery 20. By this, the state detection circuit 39 detects the battery 20 coupled to the connection section 410. Thereafter, the state detection circuit 39 generates the state signal S2 indicating a state of the battery 20 in accordance with a result of the detection and outputs the state information S2 to the control circuit 30. Note that, although the battery 20 is disposed outside the smartphone 3 in FIG. 16, the battery 20 is disposed in the accommodation section 400 included in the smartphone 3 in a detachable manner in practice.

The control circuit 30 generates the power source selection signal Sn based on the supplied state signal S2 and outputs the generated power source selection signal Sn to the power supply switching unit 35. In this way, the power supply switching unit 35 may select the voltage Vb output from the battery 20. Since the power supply switching unit 35 selects the voltage Vb based on the power source selection signal Sn and outputs the voltage Vdd, the smartphone 3 is driven by electric power in accordance with the voltage Vb supplied from the battery 20.

Furthermore, the state detection circuit 39 detects a voltage value of the voltage Vb supplied from the battery 20 and a temperature of the battery 20, for example, as a state of the battery 20, generates a state signal S2 indicating the state of the battery 20 in accordance with a result of the detection, and outputs the state signal S2 to the control circuit 10. In other words, the state detection circuit 39 obtains battery capacity and the temperature. The control circuit 10 determines whether the battery 20 is to be charged with reference to the detected voltage value of the voltage Vb and the detected temperature of the battery 20, generates a control signal S1 in accordance with a result of the determination, and outputs the control signal S1 to the charge control circuit 38. Thereafter, the charge control circuit 38 determines whether a voltage Vc supplied from the power supply switching unit 35 is to be output as a voltage Vca used to charge the battery 20 based on the input control signal S1.

Furthermore, the control circuit 30 controls driving such that each of the sections included in the smartphone 3 is driven in a normal mode or a restriction mode in which power is less consumed than the normal mode based on the connection signal Sc output from the power supply switching unit 35 and the state signal S2 output from the state detection circuit 39 of the battery control unit 36.

Here, the charge control circuit 38 included in the battery control unit 36 has the same configuration as the charge control circuit 18 according to the first embodiment, and the state detection circuit 39 has the same configuration as the state detection circuit 19 according to the first embodiment. Therefore, detailed descriptions of the charge control circuit 38 and the state detection circuit 39 are omitted. Similarly, the control circuit 30 has the same configuration as the control circuit 10 according to the first embodiment, and therefore, a detailed description of the control circuit 30 is omitted.

The smartphone 3 serving as the mobile device M according to the second embodiment which is configured as described above may also attain effects the same as the effects of the mobile printer 1 serving as the mobile device M according to the first embodiment.

3. Other Embodiments

Although the portable mobile printer 1 is taken as an example of the mobile device M according to the first embodiment described above and the smartphone 3 is taken as an example of the mobile device M according to the second embodiment, the mobile device M is at least a portable device driven by a battery and may be a tablet terminal, a cellular phone, an electronic calculator, a digital audio player, and the like. Also in this case, effects the same as the effects of the first and second embodiments may be attained.

Although the embodiments and the modifications are described hereinabove, the present disclosure is not limited to these embodiments, and various modifications may be made without departing from the scope of the disclosure. For example, the foregoing embodiments may be appropriately combined.

The present disclosure includes configurations substantially the same as the configurations described in the foregoing embodiments (for example, configurations having the same functions, the same methods, and the same results or configurations having the same purpose and the same effects). Furthermore, the present disclosure includes configurations in which unimportant portions of the configurations described in the foregoing embodiments are replaced. Moreover, the present disclosure includes configurations which may attain the same effects as the configurations described in the foregoing embodiments and configurations which may attain the same purposes as the configurations described in the foregoing embodiments. In addition, the present disclosure includes configurations obtained by adding general techniques to the configurations described in the foregoing embodiments.

What is claimed is:

1. A mobile device comprising:
    a driving circuit;
    a first accommodation section configured to accommodate a first battery which supplies electric power to the driving circuit and which is an all-solid-state battery having a solid electrolyte;
    a control circuit configured to control the driving circuit such that driving is performed in one of a plurality of modes including a first mode and a second mode in which power consumption is smaller than the first mode; and
    a determination circuit configured to determine whether electric power is supplied from an external power source to the first battery, wherein
    when the determination circuit determines that the electric power is supplied from the external power source to the first battery, the control circuit performs switching from the second mode to the first mode.

2. The mobile device according to claim 1, comprising:
    an input section configured to input an instruction issued by a user,
    wherein when receiving an instruction indicating that the switching between the second mode and the first mode is permitted based on a result of the determination performed by the determination circuit from the input section, the control circuit performs the switching from the second mode to the first mode in accordance with a result of the determination indicating that the electric power is supplied from the external power source to the first battery made by the determination circuit, and
    wherein when receiving an instruction indicating that the switching between the first mode and the second mode is not permitted based on a result of the determination performed by the determination circuit from the input section, the control circuit does not perform the switching from the second mode to the first mode in accordance with a result of the determination indicating that the electric power is supplied from the external power source to the first battery made by the determination circuit.

3. The mobile device according to claim 2, further comprising:
    a first obtaining circuit configured to obtain a remaining battery level of the first battery accommodated in the first accommodation section, wherein
    when an instruction indicating that the switching between the first mode and the second mode is not permitted is input based on a result of the determination made by the determination circuit from the input section, the control circuit performs the switching from the second mode to the first mode in accordance with the remaining battery level obtained by the first obtaining circuit.

4. The mobile device according to claim 1, further comprising:
    a first obtaining circuit configured to obtain a remaining battery level of a first battery accommodated in the first accommodation section, wherein
    the control circuit performs switching from the first mode to the second mode in accordance with the remaining battery level obtained by the first obtaining circuit.

5. The mobile device according to claim 1, further comprising:
    a second accommodation section configured to accommodate a second battery which supplies electric power to the driving circuit and which is an electrolytic solution battery having a liquid electrolyte; and
    a second obtaining circuit configured to obtain a remaining battery level of the second battery accommodated in the second accommodation section, wherein,
    when the second battery supplies electric power to the driving circuit, the control circuit performs switching from the second mode to the first mode in accordance with the remaining battery level obtained by the second obtaining circuit.

* * * * *